(12) United States Patent
Kutsukake

(10) Patent No.: US 11,456,035 B2
(45) Date of Patent: Sep. 27, 2022

(54) SEMICONDUCTOR MEMORY DEVICE

(71) Applicant: Kioxia Corporation, Tokyo (JP)

(72) Inventor: Shizuka Kutsukake, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/345,195

(22) Filed: Jun. 11, 2021

(65) Prior Publication Data

US 2022/0139458 A1    May 5, 2022

(30) Foreign Application Priority Data

Oct. 30, 2020 (JP) .............................. JP2020-182677

(51) Int. Cl.
```
G11C 16/08       (2006.01)
G11C 16/24       (2006.01)
G11C 16/30       (2006.01)
H01L 27/11556    (2017.01)
H01L 27/11582    (2017.01)
```
(52) U.S. Cl.
CPC .............. G11C 16/08 (2013.01); G11C 16/24 (2013.01); G11C 16/30 (2013.01); H01L 27/11556 (2013.01); H01L 27/11582 (2013.01)

(58) Field of Classification Search
CPC ......... G11C 16/08; G11C 16/24; G11C 16/30; H01L 27/11556; H01L 27/11582
See application file for complete search history.

(56) References Cited

U.S. PATENT DOCUMENTS

| | | | |
|---|---|---|---|
| 8,791,517 B2 * | 7/2014 | Kutsukake | H01L 27/11526 257/299 |
| 9,368,209 B2 * | 6/2016 | Milani | H01L 27/11521 |
| 9,792,860 B2 * | 10/2017 | Hokazono | G09G 3/3233 |
| 9,847,131 B2 * | 12/2017 | Widjaja | H01L 27/1023 |
| 10,403,361 B2 * | 9/2019 | Widjaja | H01L 29/7881 |
| 10,468,425 B2 * | 11/2019 | Milani | H01L 29/66825 |
| 2008/0191258 A1 | 8/2008 | Jia et al. | |
| 2010/0102875 A1 | 4/2010 | Zhao et al. | |
| 2014/0152379 A1 * | 6/2014 | Fujimoto | H01L 28/90 257/532 |
| 2019/0392905 A1 | 12/2019 | Hioka et al. | |
| 2020/0411634 A1 * | 12/2020 | Mikhalev | H01L 27/11526 |

FOREIGN PATENT DOCUMENTS

JP        2020-004466 A    1/2020

* cited by examiner

*Primary Examiner* — Tri M Hoang
(74) *Attorney, Agent, or Firm* — Oblon, McClelland, Maier & Neustadt, L.L.P.

(57) ABSTRACT

A semiconductor memory device of embodiments includes: a memory cell array including a plurality of memory cells; and a control circuit controlling an operation of each of the memory cells and including a first capacitor. The first capacitor includes: a semiconductor substrate having a first face and a second face facing the first face and including a first semiconductor region of p-type, a second semiconductor region of n-type provided between the first face and the first semiconductor region, and a third semiconductor region of p-type provided between the first face and the second semiconductor region and electrically connected to the first semiconductor region; a first electrode electrically connected to the second semiconductor region; and a first insulating film provided between the third semiconductor region and the first electrode.

14 Claims, 21 Drawing Sheets

CC' CROSS SECTION

BB' CROSS SECTION

AA' CROSS SECTION

CC' CROSS SECTION

FF' CROSS SECTION

HH' CROSS SECTION

JJ' CROSS SECTION

SEMICONDUCTOR MEMORY DEVICE

CROSS-REFERENCE TO RELATED APPLICATION

This application is based upon and claims the benefit of priority from Japanese Patent Application No. 2020-182677, filed on Oct. 30, 2020, the entire contents of which are incorporated herein by reference.

FIELD

Embodiments described herein relate generally to a semiconductor memory device.

BACKGROUND

A semiconductor memory includes a memory cell array including a plurality of memory cells having a function of storing data and a control circuit for controlling the operation of each memory cell. The control circuit includes various capacitors, such as a capacitor for stabilizing a voltage and a capacitor for a charge pump for boosting an input external voltage to generate a high internal voltage. In order to improve the characteristics of the semiconductor memory, it is desired to increase the capacitance of the capacitor.

DETAILED DESCRIPTION

Figure 1:
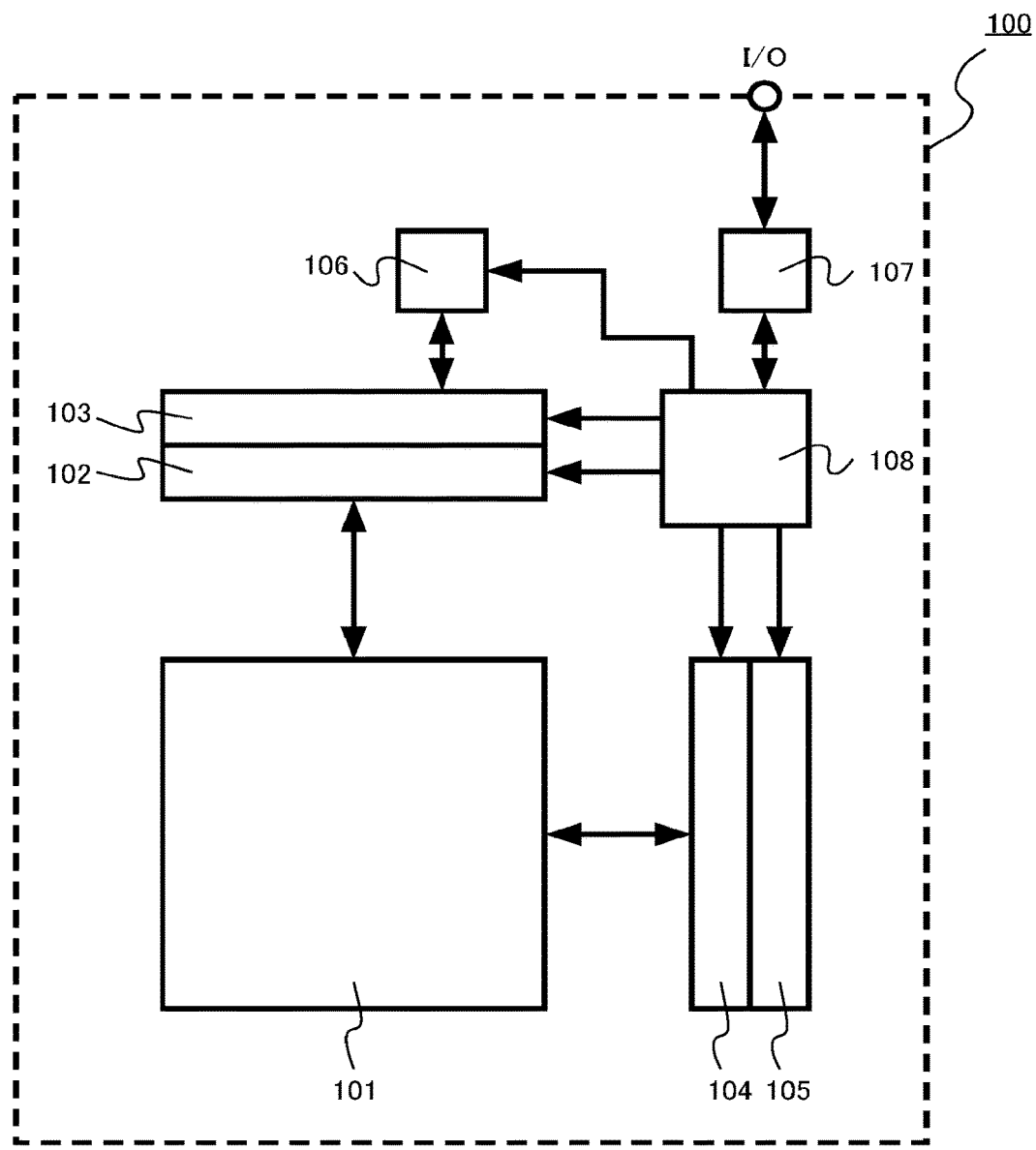
FIG. 1 is a block diagram of a semiconductor memory device of a first embodiment.

A semiconductor memory device of embodiments includes: a memory cell array including a plurality of memory cells; and a control circuit controlling an operation of each of the memory cells and including a first capacitor, wherein the first capacitor includes: a semiconductor substrate having a first face and a second face facing the first face, the semiconductor substrate including a first semiconductor region of p-type, a second semiconductor region of n-type provided between the first face and the first semiconductor region, and a third semiconductor region of p-type provided between the first face and the second semiconductor region, the third semiconductor region electrically connected to the first semiconductor region; a first electrode electrically connected to the second semiconductor region; and a first insulating film provided between the third semiconductor region and the first electrode.

Hereinafter, embodiments will be described with reference to the accompanying diagram. In the following description, the same or similar members and the like may be denoted by the same reference numerals, and the description of the members and the like once described may be omitted as appropriate.

In addition, in this specification, the term "on", "above", or "under" may be used for convenience. "On", "above", or "under" is a term indicating the relative positional relationship in the diagrams, but is not a term that defines the positional relationship with respect to gravity.

The qualitative analysis and quantitative analysis of the chemical composition of members forming the semiconductor memory device in this specification can be performed by, for example, secondary ion mass spectroscopy (SIMS), energy dispersive X-ray spectroscopy (EDX), electron energy loss spectroscopy (EELS), and the like. In addition, when measuring the depth of a semiconductor region forming the semiconductor memory device, for example, SIMS can be used. In addition, when measuring the thickness of each member forming the semiconductor memory device, a distance between members, and the like, for example, a transmission electron microscope (TEM) can be used.

In this specification, when there is a notation of $n^+$ type, n type, and $n^-$ type, this means that the impurity concentration of n type decreases in the order of type, n type, and $n^-$ type. In addition, when there is a notation of $p^+$ type, p type, and $p^-$ type, this means that the impurity concentration of p type decreases in the order of $p^+$ type, p type, and $p^-$ type. In addition, type, n type, and $n^-$ type may be collectively and simply referred to as n type. In addition, type, $p^+$ type, and $p^-$ type may be collectively and simply referred to as p type.

First Embodiment

A semiconductor memory device of a first embodiment includes: a memory cell array including a plurality of memory cells; and a control circuit controlling an operation of each of the memory cells and including a first capacitor. The first capacitor includes: a semiconductor substrate having a first face and a second face facing the first face and including a first semiconductor region of p-type, a second semiconductor region of n-type provided between the first face and the first semiconductor region, and a third semiconductor region of p-type provided between the first face and the second semiconductor region and electrically connected to the first semiconductor region; a first electrode electrically connected to the second semiconductor region; and a first insulating film provided between the third semiconductor region and the first electrode.

The semiconductor memory device of the first embodiment is a non-volatile memory 100. The non-volatile memory 100 of the first embodiment is a three-dimensional NAND flash memory in which a plurality of memory cells are three-dimensionally arranged. The non-volatile memory 100 is an example of the semiconductor memory device.

FIG. 1 is a block diagram of the semiconductor memory device of the first embodiment. FIG. 1 shows the circuit configuration of the non-volatile memory 100 of the first embodiment. As shown in FIG. 1, the non-volatile memory 100 includes a memory cell array 101, a word line driver 102, a row decoder 103, a sense amplifier 104, a column decoder 105, a charge pump 106, an input/output circuit 107, and a controller 108.

The memory cell array 101 includes a plurality of memory cells MC. The word line driver 102, the row decoder 103, the sense amplifier 104, the column decoder 105, the charge pump 106, the input/output circuit 107, and the controller 108 control the operation of each memory cell MC. The word line driver 102, the row decoder 103, the sense amplifier 104, the column decoder 105, the charge pump 106, the input/output circuit 107, and the controller 108 are an example of a control circuit.

Figure 2:
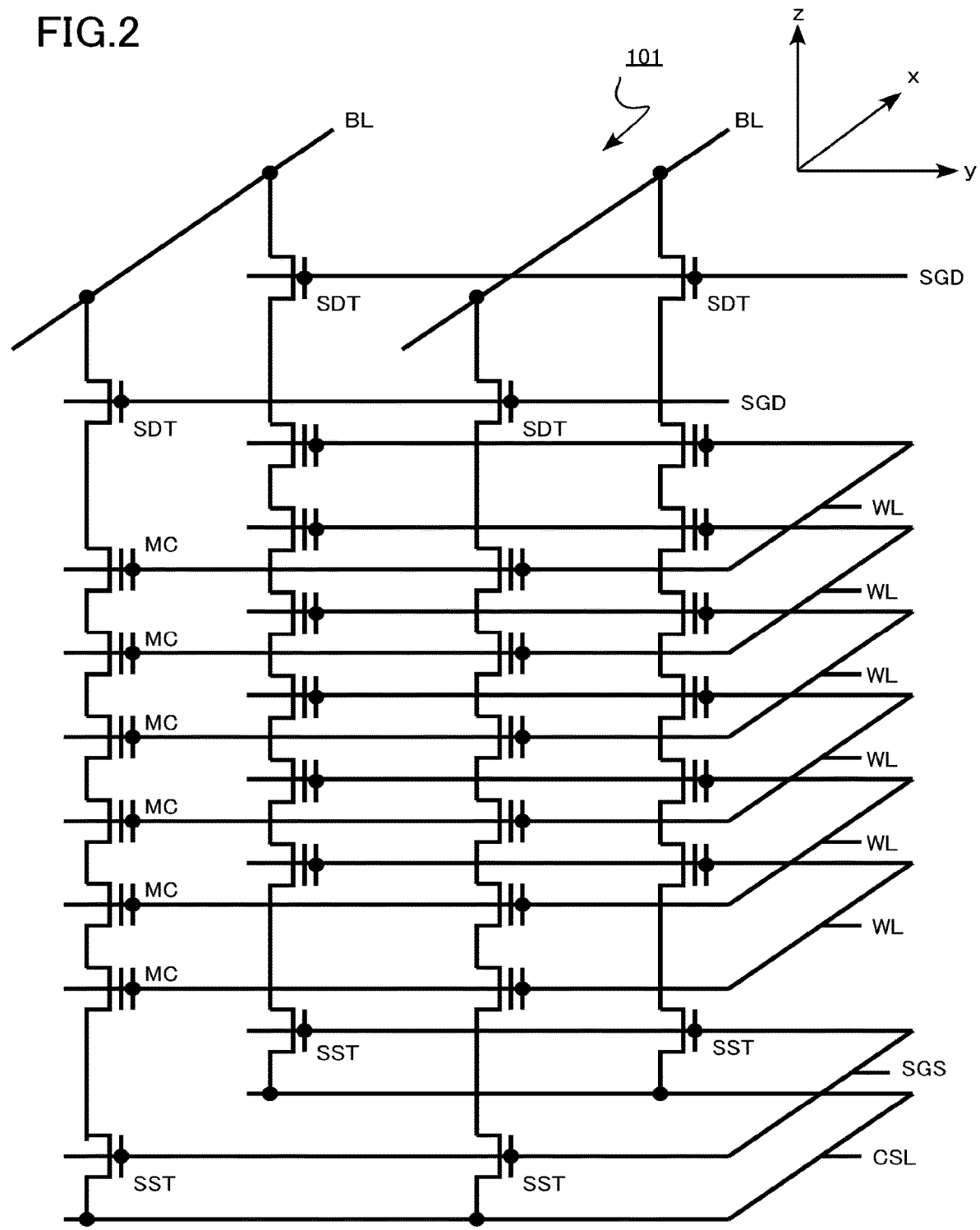
FIG. 2 is an equivalent circuit diagram of a memory cell array of the semiconductor memory device of the first embodiment.

FIG. 2 is an equivalent circuit diagram of a memory cell array of the semiconductor memory device of the first embodiment. FIG. 2 schematically shows a wiring structure in the memory cell array 101. The memory cell array 101 of the first embodiment has a three-dimensional structure in which a plurality of memory cells MC are arranged in a three-dimensional manner.

Hereinafter, the y direction crosses the x direction. The z direction crosses the x and y directions. For example, the x direction and the y direction are perpendicular to each other. For example, the z direction and the x and y directions are perpendicular to each other.

As shown in FIG. 2, the memory cell array 101 includes a plurality of memory cells MC, a source selection transistor SST, a drain selection transistor SDT, a plurality of word lines WL, a plurality of bit lines BL, a common source line CSL, a source selection gate line SGS, and a plurality of drain selection gate lines SGD.

A plurality of memory cells MC are connected in series in the z direction. A plurality of memory cells MC are connected between the source selection transistor SST and the drain selection transistor SDT.

Each memory cell MC has, for example, a metal oxide nitride oxide semiconductor (MONOS) structure having a charge storage layer as an insulator. The threshold voltage of the transistor of the memory cell MC changes according to the amount of charge stored in the charge storage layer. By changing the threshold voltage of the transistor, the on-current of the transistor changes. For example, if a state in which the threshold voltage is high and the on-current is low is defined as data "0" and a state in which the threshold voltage is low and the on-current is high is defined as data "1", the memory cell MC can store 1-bit data of "0" and "1".

The word line WL functions as a gate electrode of the transistor of the memory cell MC. The gate voltage of the memory cell MC is controlled by using the word line WL. The word line WL is an example of the gate electrode.

The source selection transistor SST is electrically connected to the common source line CSL. The source selection transistor SST is controlled by the voltage applied to the source selection gate line SGS.

The drain selection transistor SDT is connected to the bit line BL. The drain selection transistor SDT is controlled by the voltage applied to the drain selection gate line SGD.

The plurality of word line WLs are electrically connected to the word line driver 102. The plurality of bit lines BL are electrically connected to the sense amplifier 104.

The row decoder 103 has a function of selecting the word line WL according to an input low address signal. The word line driver 102 has a function of applying a predetermined gate voltage to the word line WL selected by the row decoder 103.

The column decoder 105 has a function of selecting the bit line BL according to the input column address signal. The sense amplifier 104 has a function of applying a predetermined voltage to the bit line BL selected by the column decoder 105. In addition, the sense amplifier 104 has a function of detecting and amplifying a current flowing through the selected bit line BL or a voltage of the selected bit line BL.

The charge pump 106 has a function of boosting a power supply voltage input from the outside of the non-volatile memory 100 to generate a high internal voltage. The charge pump 106 is a booster circuit. For example, the input power supply voltage is boosted to generate a program voltage. The program voltage is applied to the word line WL when writing a data to the memory cell MC. The charge pump 106 includes a capacitor (not shown in FIG. 1).

The input/output circuit 107 has a function of transmitting and receiving an input/output signal I/O to and from the outside of the non-volatile memory 100 through an I/O terminal. The input/output circuit 107 includes a capacitor for stabilizing the voltage.

The controller 108 has a function of controlling the word line driver 102, the row decoder 103, the sense amplifier 104, the column decoder 105, the charge pump 106, the input/output circuit 107, and other circuits (not shown in FIG. 1).

Circuits, such as the word line driver 102, the row decoder 103, the sense amplifier 104, the column decoder 105, the charge pump 106, the input/output circuit 107, and the controller 108, are formed by, for example, transistors and wiring layers using a semiconductor substrate (not shown in FIGS. 1 and 2).

For example, in FIG. 2, when reading the data stored in the memory cell MC, a read voltage is applied to the word line WL connected to the memory cell MC. When the transistor of the memory cell MC is turned on, a current flows between the common source line CSL and the bit line BL. The data stored in the memory cell MC is determined based on the current flowing between the common source line CSL and the bit line BL.

For example, the current flowing through the bit line BL is amplified by the sense amplifier 104, and the data stored in the memory cell MC is determined by the controller 108. Alternatively, the voltage change of the bit line BL is amplified by the sense amplifier 104, and the data stored in the memory cell MC is determined by the controller 108.

FIG. 2 shows a case where the number of memory cells MC connected in series to each other is 6 and the number of bit lines is 2. However, the number of memory cells MC connected in series to each other is not limited to 6, and the number of bit lines is not limited to 2.

Figure 3A:
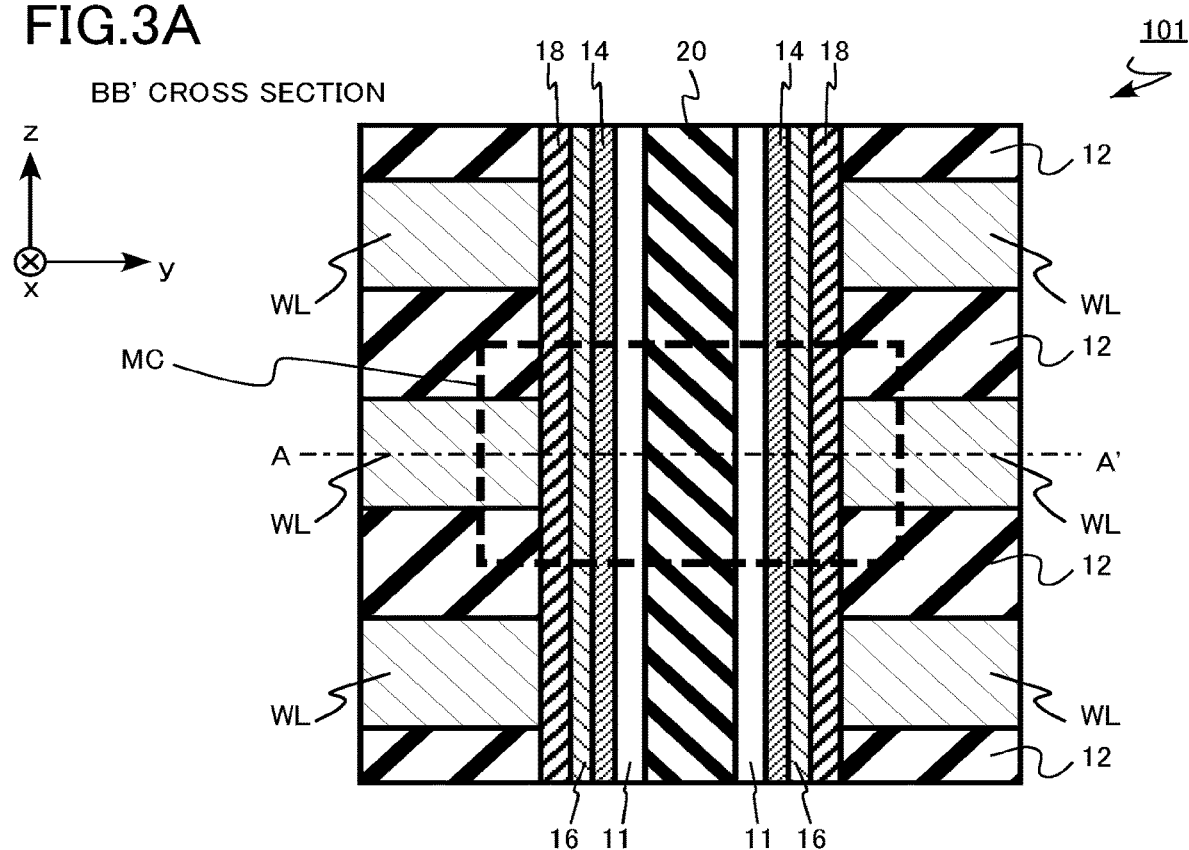
FIGS. 3A and 3B are schematic cross-sectional views of a part of the memory cell array of the semiconductor memory device of the first embodiment.
Figure 3B:
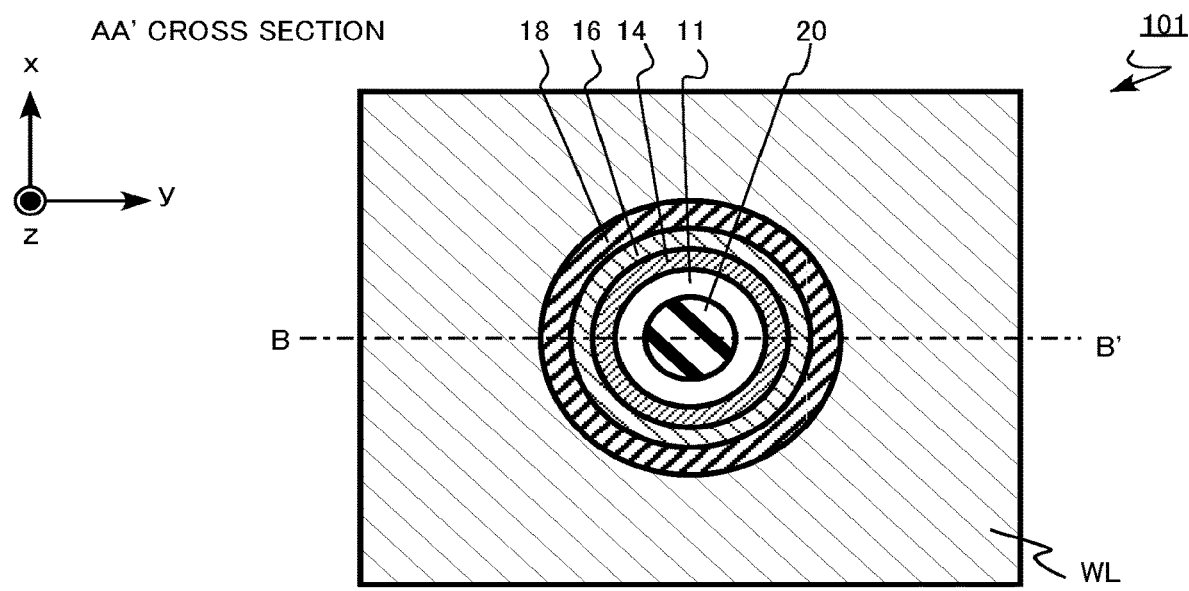

FIGS. 3A and 3B are schematic cross-sectional views of a part of the memory cell array of the semiconductor memory device of the first embodiment. FIG. 3A is a yz cross section of the memory cell array 101. FIG. 3A is a BB' cross section of FIG. 3B. FIG. 3B is an xy cross section of the memory cell array 101. FIG. 3B is an AA' cross section of FIG. 3A.

In FIGS. 3A and 3B, a region surrounded by the broken line is one memory cell MC.

The memory cell array 101 includes a semiconductor layer 11, an interlayer insulating layer 12, a tunnel insulating film 14, a charge storage layer 16, a block insulating film 18, a core insulating layer 20, and a word line WL. The word line WL is an example of the gate electrode.

The charge storage layer 16 is provided between the semiconductor layer 11 and the word line WL. The tunnel insulating film 14 is provided between the semiconductor layer 11 and the charge storage layer 16. The block insulating film 18 is provided between the charge storage layer 16 and the word line WL.

The semiconductor layer 11 functions as a channel of the transistor of the memory cell MC. The charge storage layer 16 has a function of storing charges. The word line WL functions as a gate electrode of the transistor of the memory cell MC.

The semiconductor layer 11 is, for example, polycrystalline silicon. The interlayer insulating layer 12 is, for example, silicon oxide. The tunnel insulating film 14 is, for example, silicon oxide. The charge storage layer 16 is, for example, silicon nitride. The block insulating film 18 is, for example, aluminum oxide. The core insulating layer 20 is, for example, silicon oxide. The word line WL is, for example, tungsten (W).

Figure 4:
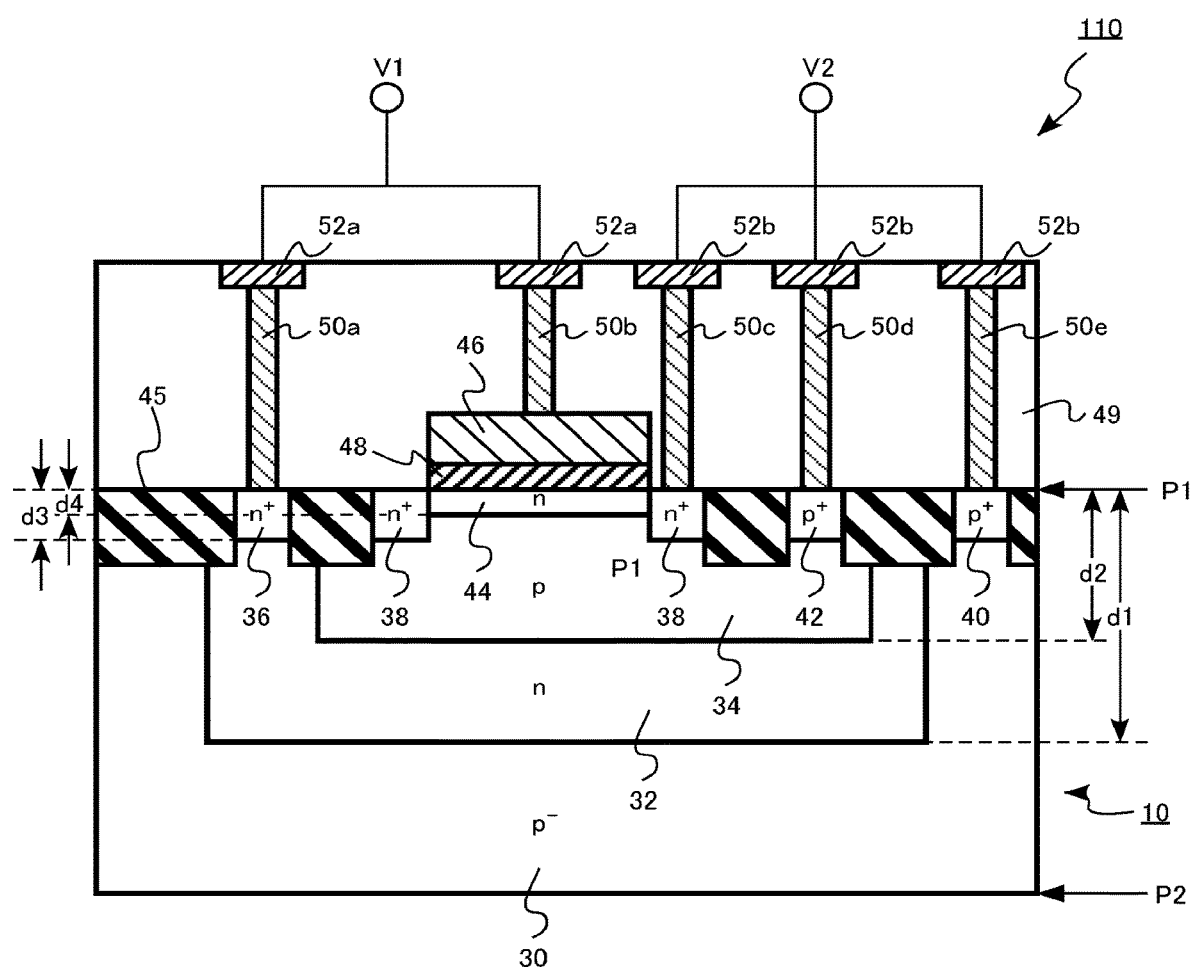
FIG. 4 is a schematic cross-sectional view of the semiconductor memory device of the first embodiment.
Figure 5:
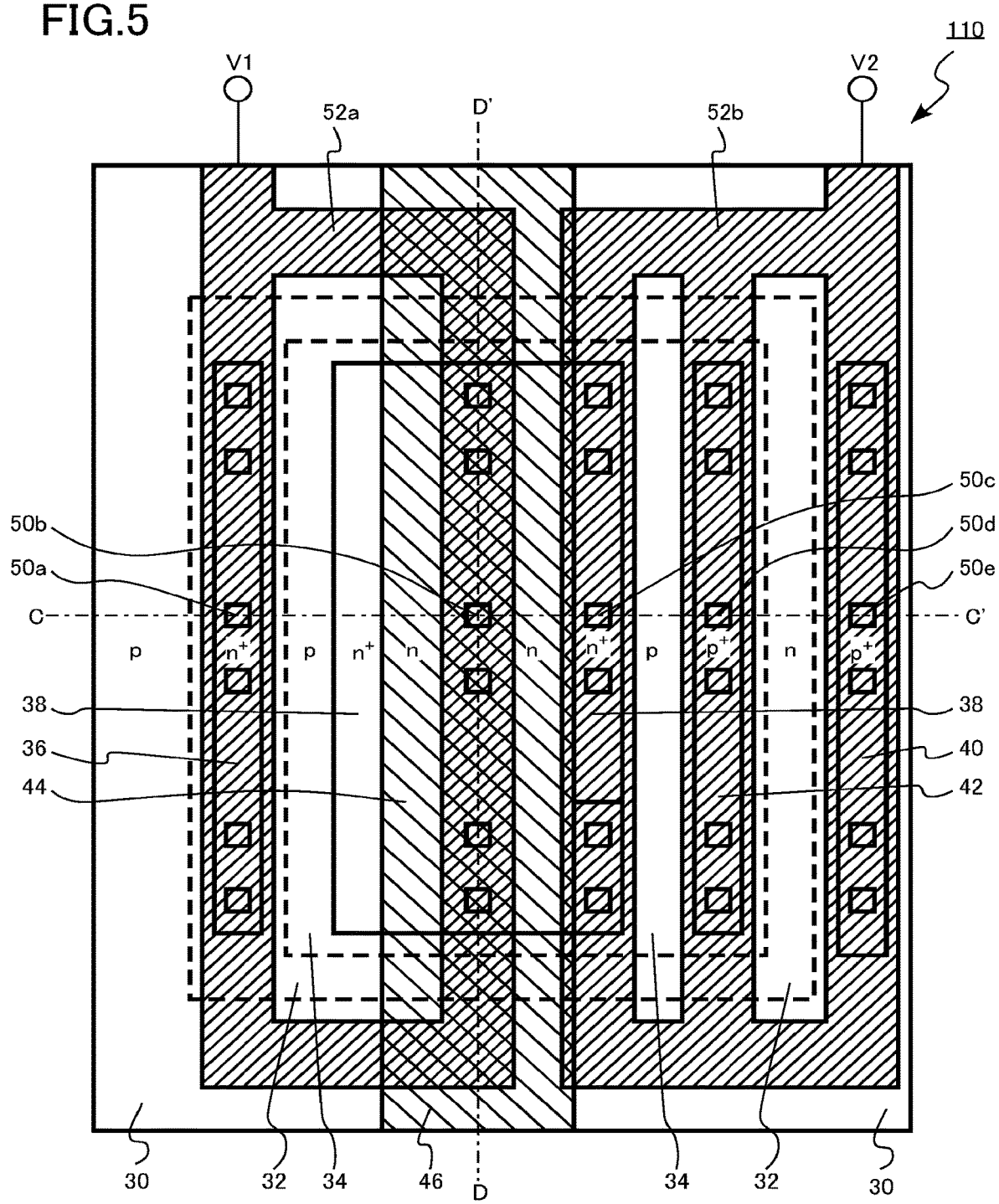
FIG. 5 is a pattern layout diagram of the semiconductor memory device of the first embodiment.
Figure 6:
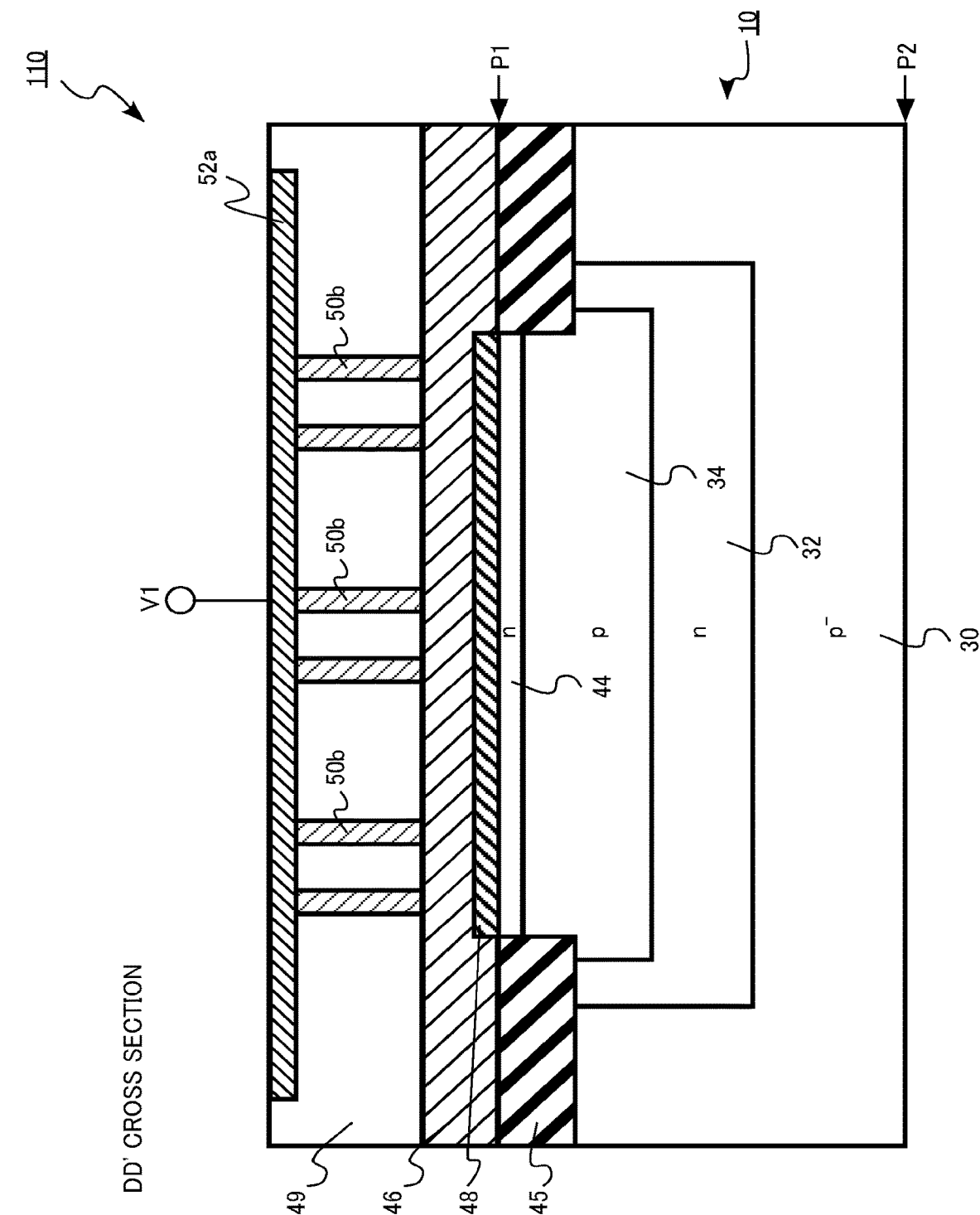
FIG. 6 is a schematic cross-sectional view of the semiconductor memory device of the first embodiment.

FIG. 4 is a schematic cross-sectional view of the semiconductor memory device of the first embodiment. FIG. 5 is a pattern layout diagram of the semiconductor memory device of the first embodiment. FIG. 6 is a schematic cross-sectional view of the semiconductor memory device of the first embodiment. FIG. 4 is a CC' cross section of FIG. 5. FIG. 6 is a DD' cross section of FIG. 5.

FIGS. 4, 5, and 6 are schematic diagrams of a first capacitor 110 of the non-volatile memory 100. The first capacitor 110 is, for example, a capacitor included in the charge pump 106.

The first capacitor 110 includes a semiconductor substrate 10, an element isolation region 45, a first capacitor electrode 46, a first capacitor insulating film 48, an interlayer insulating layer 49, a contact plug 50a, a contact plug 50b, a contact plug 50c, a contact plug 50d, a contact plug 50e, a first wiring layer 52a, and a second wiring layer 52b. The semiconductor substrate 10 includes a p-type region 30, a first n-well 32, a first p-well 34, a first n-type contact region 36, a second n-type contact region 38, a first p-type contact region 40, a second p-type contact region 42, and a first n-type region 44.

The p-type region 30 is an example of a first semiconductor region. The first n-well 32 is an example of a second semiconductor region. The first p-well 34 is an example of a third semiconductor region. The second n-type contact region 38 is an example of a fourth semiconductor region. The first n-type region 44 is an example of a fifth semiconductor region. The first capacitor electrode 46 is an example of a first electrode. The first capacitor insulating film 48 is an example of a first insulating film.

The semiconductor substrate 10 is, for example, a single crystal semiconductor. The semiconductor substrate 10 is, for example, single crystal silicon.

The semiconductor substrate 10 has a first face P1 and a second face P2. The second face P2 faces the first face P1. The first face P1 is a surface of the semiconductor substrate 10. The second face P2 is a back surface of the semiconductor substrate 10.

The p-type region 30 is a p$^-$-type semiconductor. The p-type region 30 contains p-type impurities. The p-type impurity is, for example, boron (B). The maximum impurity concentration of p-type impurities in the p-type region 30 is, for example, equal to or more than $1\times10^{14}$ cm$^{-3}$ and equal to or less than $1\times10^{15}$ cm$^{-3}$.

The first n-well 32 is provided between the first face P1 and the p-type region 30. The first n-well 32 is surrounded by, for example, the p-type region 30.

The first n-well 32 is an n-type semiconductor. The first n-well 32 is, for example, n-type single crystal silicon.

The first n-well 32 contains n-type impurities. The n-type impurity is, for example, phosphorus (P). The maximum impurity concentration of n-type impurities in the first n-well 32 is, for example, equal to or more than $1\times10^{16}$ cm$^{-3}$ and equal to or less than $1\times10^{18}$ cm$^{-3}$. The depth (d1 in FIG. 4) of the first n-well 32 is, for example, equal to or more than 2 μm and equal to or less than 4 μm.

The first p-well 34 is provided between the first face P1 and the first n-well 32. The first p-well 34 is surrounded by, for example, the first n-well 32. The first p-well 34 is a p-type semiconductor. The first p-well 34 is, for example, p-type single crystal silicon.

The first p-well 34 is electrically connected to the p-type region 30.

The first p-well 34 contains p-type impurities. The p-type impurity is, for example, boron (B). The maximum impurity concentration of p-type impurities in the first p-well 34 is higher than, for example, the maximum impurity concentration of p-type impurities in the p-type region 30. The maximum impurity concentration of p-type impurities in the first p-well 34 is, for example, equal to or more than $1\times10^{16}$ cm$^{-3}$ and equal to or less than $1\times10^{18}$ cm$^{-3}$.

The depth (d2 in FIG. 4) of the first p-well 34 is smaller than the depth (d1 in FIG. 4) of the first n-well 32. The depth (d2 in FIG. 4) of the first p-well 34 is, for example, equal to or more than 1 μm and equal to or less than 3 μm.

The first n-type contact region 36 is provided between the first face P1 and the first n-well 32. The first n-type contact region 36 is surrounded by, for example, the first n-well 32. The first n-type contact region 36 is an n$^+$-type semiconductor. The first n-type contact region 36 is, for example, n$^+$-type single crystal silicon.

The first n-type contact region 36 contains n-type impurities. The n-type impurity is, for example, arsenic (As) or phosphorus (P). The maximum impurity concentration of n-type impurities in the first n-type contact region 36 is higher than, for example, the maximum impurity concentration of n-type impurities in the first n-well 32. The maximum impurity concentration of n-type impurities in the first n-type contact region 36 is, for example, equal to or more than $1\times10^{19}$ cm$^{-3}$ and equal to or less than $1\times10^{21}$ cm$^{-3}$. The depth (d3 in FIG. 4) of the first n-type contact region 36 is smaller than the depth (d1 in FIG. 4) of the first n-well 32.

The second n-type contact region 38 is provided between the first face P1 and the first p-well 34. The second n-type contact region 38 is surrounded by, for example, the first p-well 34. The second n-type contact region 38 is provided on the side of the first p-well 34 of the end of the first capacitor electrode 46. For example, the second n-type contact regions 38 are provided in the first p-well 34 so as to be located on both sides of the first capacitor electrode 46 with the first capacitor electrode 46 interposed between the second n-type contact regions 38.

The second n-type contact region 38 is an $n^+$-type semiconductor. The second n-type contact region 38 is, for example, $n^+$-type single crystal silicon.

The second n-type contact region 38 contains $n^+$-type impurities. The n-type impurity is, for example, arsenic (As) or phosphorus (P). The maximum impurity concentration of n-type impurities in the second n-type contact region 38 is higher than, for example, the maximum impurity concentration of n-type impurities in the first n-well 32. The maximum impurity concentration of n-type impurities in the second n-type contact region 38 is, for example, equal to or more than $1\times10^{19}$ cm$^{-3}$ and equal to or less than $1\times10^{21}$ cm$^{-3}$.

The depth (d3 in FIG. 4) of the second n-type contact region 38 is smaller than the depth (d2 in FIG. 4) of the first p-well 34.

The second n-type contact region 38 is electrically connected to the first p-well 34 and the p-type region 30.

The first p-type contact region 40 is provided between the first face P1 and the p-type region 30. The first p-type contact region 40 is surrounded by, for example, the p-type region 30. The first p-type contact region 40 is a $p^+$-type semiconductor. The first p-type contact region 40 is, for example, $p^+$-type single crystal silicon.

The first p-type contact region 40 contains p-type impurities. The p-type impurity is, for example, boron (B). The maximum impurity concentration of p-type impurities in the first p-type contact region 40 is higher than the maximum impurity concentration of p-type impurities in the p-type region 30.

The first p-type contact region 40 is electrically connected to the second n-type contact region 38 and the second p-type contact region 42.

The second p-type contact region 42 is provided between the first face P1 and the first p-well 34. The second p-type contact region 42 is surrounded by, for example, the first p-well 34. The second p-type contact region 42 is a $p^+$-type semiconductor. The second p-type contact region 42 is, for example, $p^+$-type single crystal silicon.

The second p-type contact region 42 contains p-type impurities. The p-type impurity is, for example, boron (B). The maximum impurity concentration of p-type impurities in the second p-type contact region 42 is higher than the maximum impurity concentration of p-type impurities in the first p-well 34.

The second p-type contact region 42 is electrically connected to the second n-type contact region 38 and the first p-type contact region 40.

The first n-type region 44 is provided between the first face P1 and the first p-well 34. The first n-type region 44 is surrounded by, for example, the first p-well 34. The first n-type region 44 is provided between the first capacitor insulating film 48 and the first p-well 34. The first n-type region 44 is in contact with the second n-type contact region 38. The first n-type region 44 is in contact with, for example, the first capacitor insulating film 48.

The first n-type region 44 is an n-type semiconductor. The first n-type region 44 is, for example, n-type single crystal silicon.

The first n-type region 44 contains n-type impurities. The n-type impurity is, for example, arsenic (As) or phosphorus (P). The maximum impurity concentration of n-type impurities in the first n-type region 44 is lower than, for example, the maximum impurity concentration of n-type impurities in the second n-type contact region 38. The depth (d4 in FIG. 4) of the first n-type region 44 is smaller than, for example, the depth (d3 in FIG. 4) of the second n-type contact region 38.

The element isolation region 45 is provided on the side of the first face P1 of the semiconductor substrate 10. The element isolation region 45 is provided, for example, between the first n-type contact region 36 and the second n-type contact region 38. The element isolation region 45 is provided, for example, between the second n-type contact region 38 and the second p-type contact region 42. The element isolation region 45 is provided, for example, between the second p-type contact region 42 and the first p-type contact region 40.

The element isolation region 45 is an insulator. The element isolation region 45 contains, for example, silicon oxide.

The first capacitor electrode 46 is provided on the side of the first face P1 of the semiconductor substrate 10. The first capacitor electrode 46 is provided above the first p-well 34. The first capacitor electrode 46 is provided above the first n-type region 44.

The first capacitor electrode 46 is a conductor. The first capacitor electrode 46 is, for example, a semiconductor, a metal semiconductor compound, or a metal. The first capacitor electrode 46 is, for example, polycrystalline silicon containing n-type impurities or p-type impurities.

The first capacitor electrode 46 is electrically connected to the first n-well 32 and the first n-type contact region 36.

The first capacitor insulating film 48 is provided between the first p-well 34 and the first capacitor electrode 46. The first capacitor insulating film 48 is provided, for example, between the first n-type region 44 and the first capacitor electrode 46.

The first capacitor insulating film 48 is an insulator. The first capacitor insulating film 48 is, for example, an oxide, a nitride, or an oxynitride. The first capacitor insulating film 48 contains, for example, silicon oxide.

The thickness of the first capacitor insulating film 48 is, for example, equal to or more than 2 nm and equal to or less than 45 nm. The thickness of the first capacitor insulating film 48 is, for example, equal to or more than 30 nm and equal to or less than 45 nm.

The interlayer insulating layer 49 is provided on the side of the first face P1 of the semiconductor substrate 10. The interlayer insulating layer 49 is provided on the first n-type contact region 36, the second n-type contact region 38, the first p-type contact region 40, the second p-type contact region 42, the element isolation region 45, and the first capacitor electrode 46.

The interlayer insulating layer 49 is an insulator. The interlayer insulating layer 49 is, for example, an oxide, a nitride, or an oxynitride. The interlayer insulating layer 49 contains, for example, silicon oxide.

The contact plug 50a, the contact plug 50b, the contact plug 50c, the contact plug 50d, and the contact plug 50e are provided in the interlayer insulating layer 49. The contact plug 50a, the contact plug 50b, the contact plug 50c, the contact plug 50d, and the contact plug 50e are conductors. The contact plug 50a, the contact plug 50b, the contact plug 50c, the contact plug 50d, and the contact plug 50e are, for example, metal.

The contact plug 50a is in contact with the first n-type contact region 36. The contact plug 50b is in contact with the first capacitor electrode 46. The contact plug 50c is in contact with the second n-type contact region 38. The contact plug 50d is in contact with the second p-type contact region 42. The contact plug 50e is in contact with the first p-type contact region 40.

The first wiring layer 52a and the second wiring layer 52b are provided in the interlayer insulating layer 49. The first wiring layer 52a and the second wiring layer 52b are conductors. The first wiring layer 52a and the second wiring layer 52b are, for example, metal.

The first wiring layer 52a is in contact with the contact plug 50a and the contact plug 50b. The first n-well 32 and the first capacitor electrode 46 are electrically connected to each other by using the first wiring layer 52a, the contact plug 50a, and the contact plug 50b.

A first voltage V1 is applied to the first wiring layer 52a. The first voltage V1 is applied to the first n-well 32 and the first capacitor electrode 46.

The first voltage V1 is, for example, a program voltage Vprog applied to the gate electrode of the memory cell MC when reading the data stored in the memory cell MC. The program voltage Vprog is, for example, equal to or more than 20 V and equal to or less than 30 V.

The first wiring layer 52a is electrically connected to, for example, the word line WL of the memory cell array 101. The first wiring layer 52a is electrically connected to the word line WL through, for example, the row decoder 103 and the word line driver 102. The word line WL is an example of the gate electrode of the memory cell MC.

The first capacitor electrode 46 is electrically connected to the first wiring layer 52a. Therefore, the first capacitor electrode 46 is electrically connected to the word line WL.

The second wiring layer 52b is in contact with the contact plug 50c, the contact plug 50d, and the contact plug 50e. The second n-type contact region 38, the first p-well 34, and the p-type region 30 are electrically connected to each other by using the second wiring layer 52b, the contact plug 50c, the contact plug 50d, and the contact plug 50e.

A second voltage V2 is applied to the second wiring layer 52b. The second voltage V2 is applied to the second n-type contact region 38, the first p-well 34, and the p-type region 30.

The first voltage V1 is higher than the second voltage V2. The second voltage V2 is, for example, 0 V. The second wiring layer 52b is grounded, for example. The second wiring layer 52b is fixed to, for example, the ground potential.

Next, the function and effect of the semiconductor memory device of the first embodiment will be described.

A semiconductor memory includes a memory cell array including a plurality of memory cells having a function of storing data and a control circuit for controlling the operation of each memory cell. The control circuit includes various capacitors, such as a capacitor for stabilizing a voltage and a capacitor for a charge pump for boosting an input external voltage to generate a high internal voltage. In order to improve the characteristics of the semiconductor memory, it is desired to increase the capacitance of the capacitor.

Figure 7:
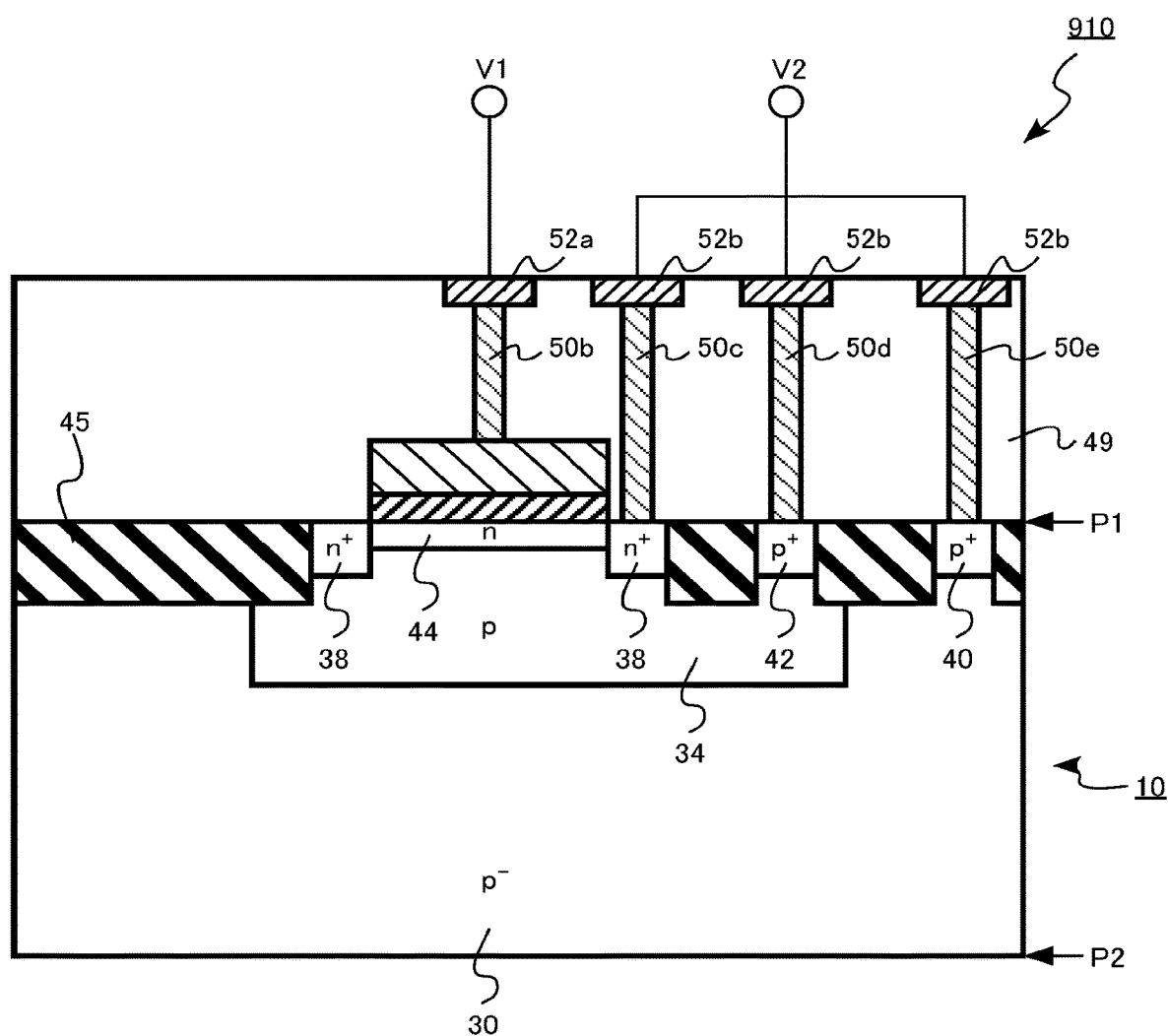
FIG. 7 is a schematic cross-sectional view of a semiconductor memory device of a comparative example.

FIG. 7 is a schematic cross-sectional view of a semiconductor memory device of a comparative example. FIG. 7 is a cross-sectional view corresponding to FIG. 4. FIG. 7 is a cross-sectional view of a capacitor 910.

The capacitor 910 is different from the first capacitor 110 of the first embodiment in that the capacitor 910 does not include the first n-well 32.

The capacitor 910 includes a semiconductor substrate 10, an element isolation region 45, a first capacitor electrode 46, a first capacitor insulating film 48, an interlayer insulating layer 49, a contact plug 50b, a contact plug 50c, a contact plug 50d, a contact plug 50e, a first wiring layer 52a, and a second wiring layer 52b. The semiconductor substrate 10 includes a p-type region 30, a first p-well 34, a second n-type contact region 38, a first p-type contact region 40, a second p-type contact region 42, and a first n-type region 44.

The first wiring layer 52a is in contact with the contact plug 50b. A first voltage V1 is applied to the first wiring layer 52a. The first voltage V1 is applied to the first capacitor electrode 46.

The second wiring layer 52b is in contact with the contact plug 50c, the contact plug 50d, and the contact plug 50e. The second n-type contact region 38, the first p-well 34, and the p-type region 30 are electrically connected to each other by using the second wiring layer 52b, the contact plug 50c, the contact plug 50d, and the contact plug 50e.

A second voltage V2 is applied to the second wiring layer 52b. The second voltage V2 is applied to the second n-type contact region 38, the first p-well 34, and the p-type region 30.

The first voltage V1 is higher than the second voltage V2. The second voltage V2 is, for example, 0 V. The second wiring layer 52b is grounded, for example. The second wiring layer 52b is fixed to, for example, the ground potential.

Figure 8A:
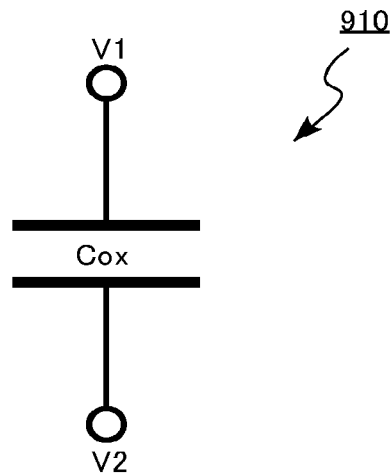
FIGS. 8A and 8B are explanatory diagrams of the function and effect of the semiconductor memory device of the first embodiment.
Figure 8B:
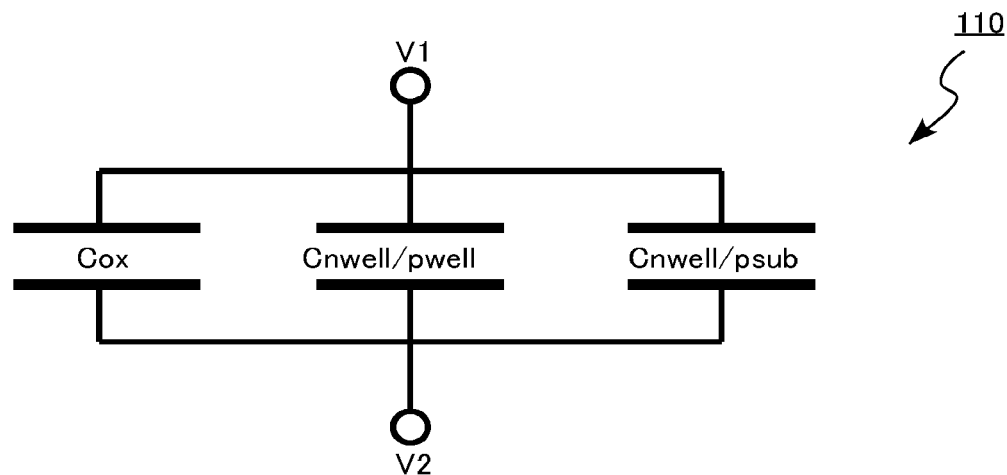

FIGS. 8A and 8B are explanatory diagrams of the function and effect of the semiconductor memory device of the first embodiment. FIG. 8A is an equivalent circuit diagram of the capacitor 910 of the comparative example, and FIG. 8B is an equivalent circuit diagram of the first capacitor 110 of the first embodiment.

The capacitor 910 of the comparative example has, as its capacitance, an insulating film capacitance Cox of a capacitor formed by the first capacitor electrode 46, the first capacitor insulating film 48, and the first n-type region 44.

On the other hand, the first capacitor 110 of the first embodiment has, as its capacitance, not only the insulating film capacitance Cox but also the junction capacitance Cnwell/pwell between the first n-well 32 and the first p-well 34 and the junction capacitance Cnwell/psub between the first n-well 32 and the p-type region 30 in parallel.

Therefore, the first capacitor 110 has a larger capacitance than the capacitor 910 by the capacitance of the junction capacitance Cnwell/pwell and the junction capacitance Cnwell/psub. Therefore, according to the non-volatile memory 100 of the first embodiment, it is possible to increase the capacitance of the capacitor as compared with the comparative example.

The first capacitor 110 has the first n-type region 44 between the first p-well 34 and the first capacitor insulating film 48. Due to the first n-type region 44, the insulating film capacitance Cox is stable as compared with a case where the first n-type region 44 is not present.

Due to the first n-type region 44, the inversion voltage of the first p-well 34 when the first voltage V1 is applied to the first capacitor electrode 46 drops. Therefore, for example, even if the first voltage V1 fluctuates, the capacitance in the strongly inverted state can be stably used, so that the insulating film capacitance Cox is stable.

In FIG. 4, a case where the contact plug 50c is provided only on the second n-type contact region 38 at one end of the first capacitor electrode 46 has been described as an example. However, it is also possible to provide the contact plug 50c on the second n-type contact region 38 at the other end of the first capacitor electrode 46 and connect the contact plug 50c to the second wiring layer 52b.

First Modification Example

Figure 9:
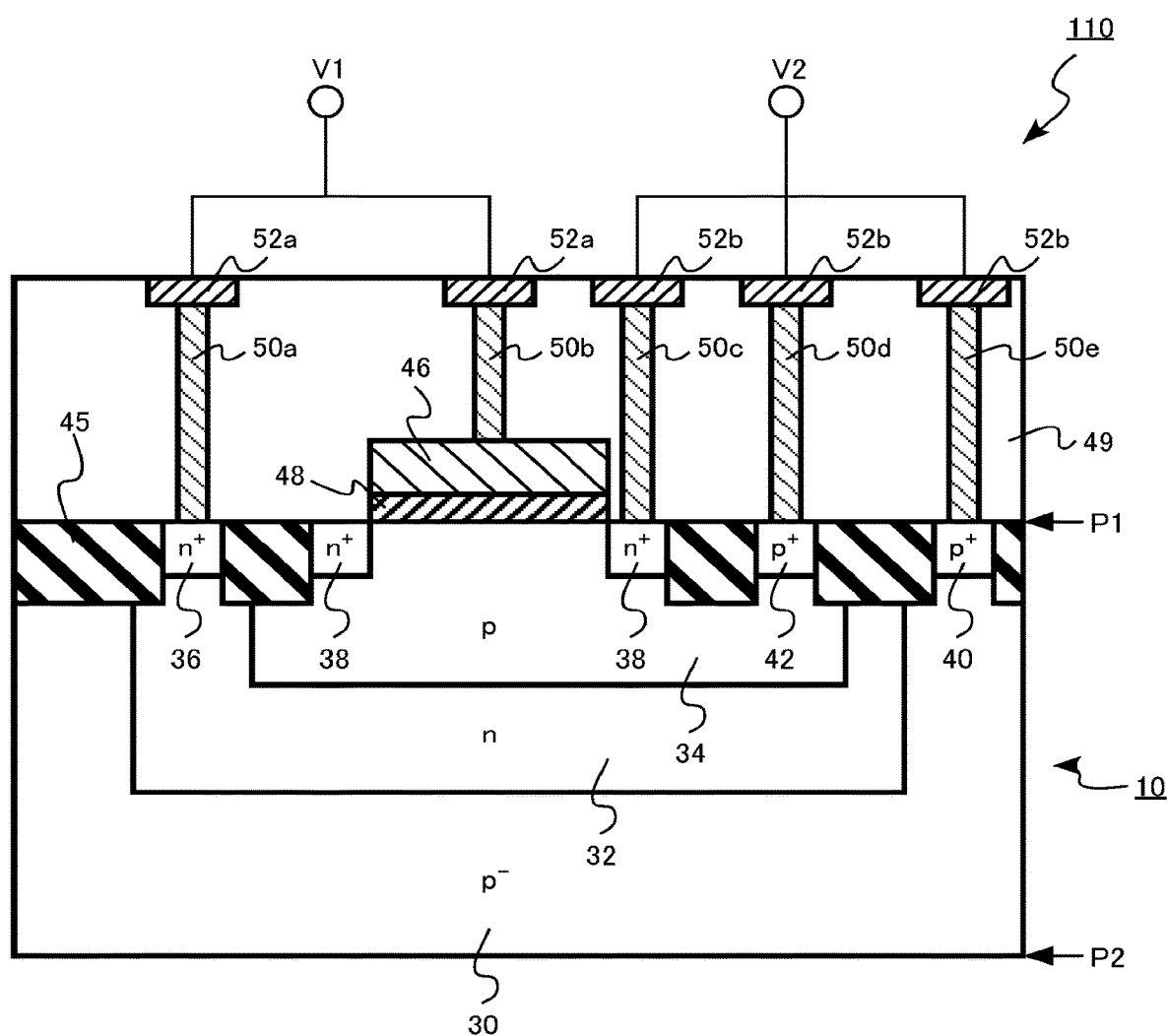
FIG. 9 is a schematic cross-sectional view of a first modification example of the semiconductor memory device of the first embodiment.

FIG. 9 is a schematic cross-sectional view of a first modification example of the semiconductor memory device of the first embodiment. FIG. 9 is a cross-sectional view corresponding to FIG. 4.

A first capacitor 110 of the first modification example is different from the first capacitor 110 of the first embodiment in that the first capacitor 110 of the first modification example does not include the first n-type region 44. Similar to the first capacitor 110 of the first embodiment, in the first capacitor 110 of the first modification example, it is possible to increase the capacitance of the capacitor as compared with the comparative example.

Second Modification Example

Figure 10:
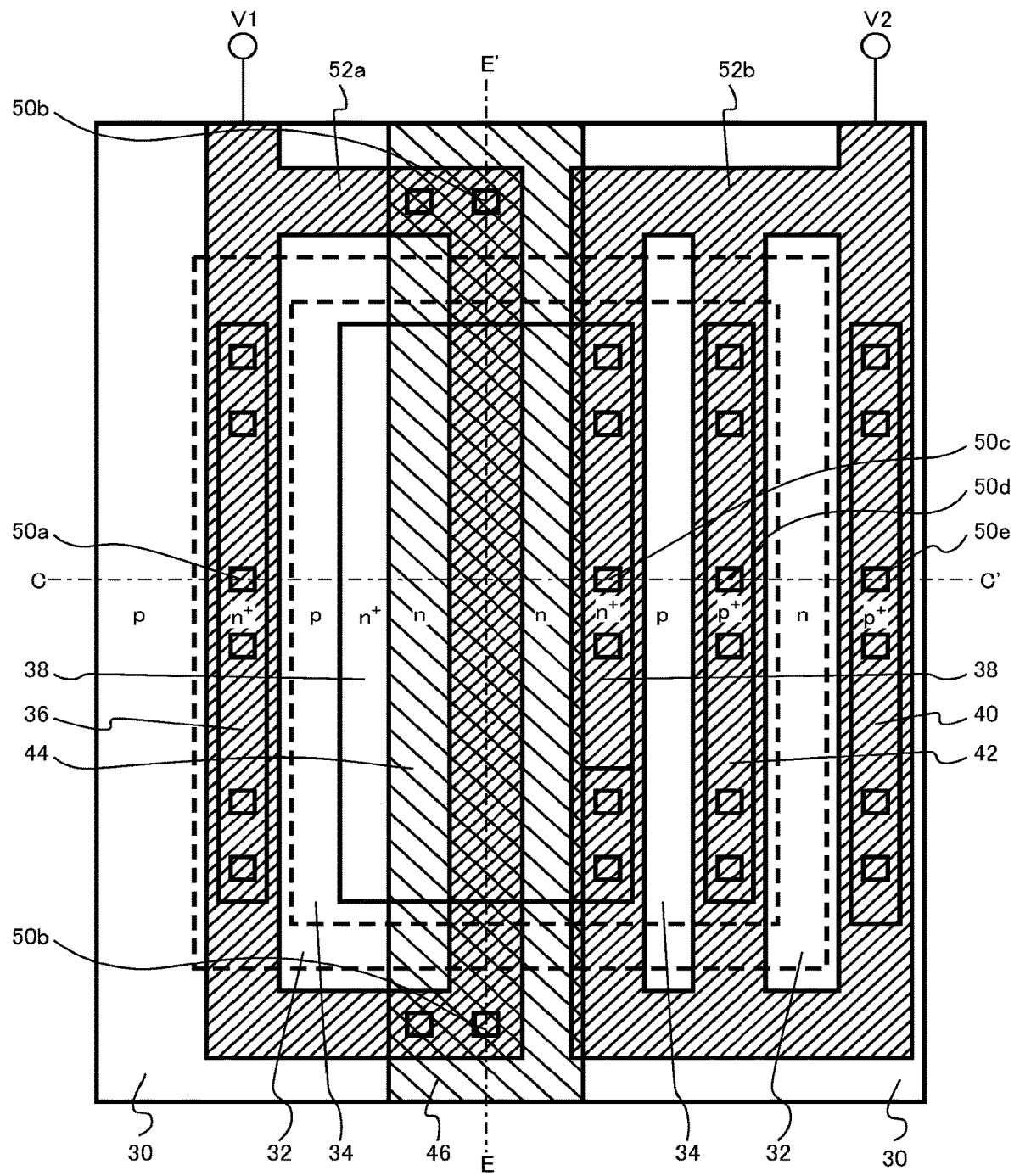
FIG. 10 is a pattern layout diagram of a second modification example of the semiconductor memory device of the first embodiment.
Figure 11:
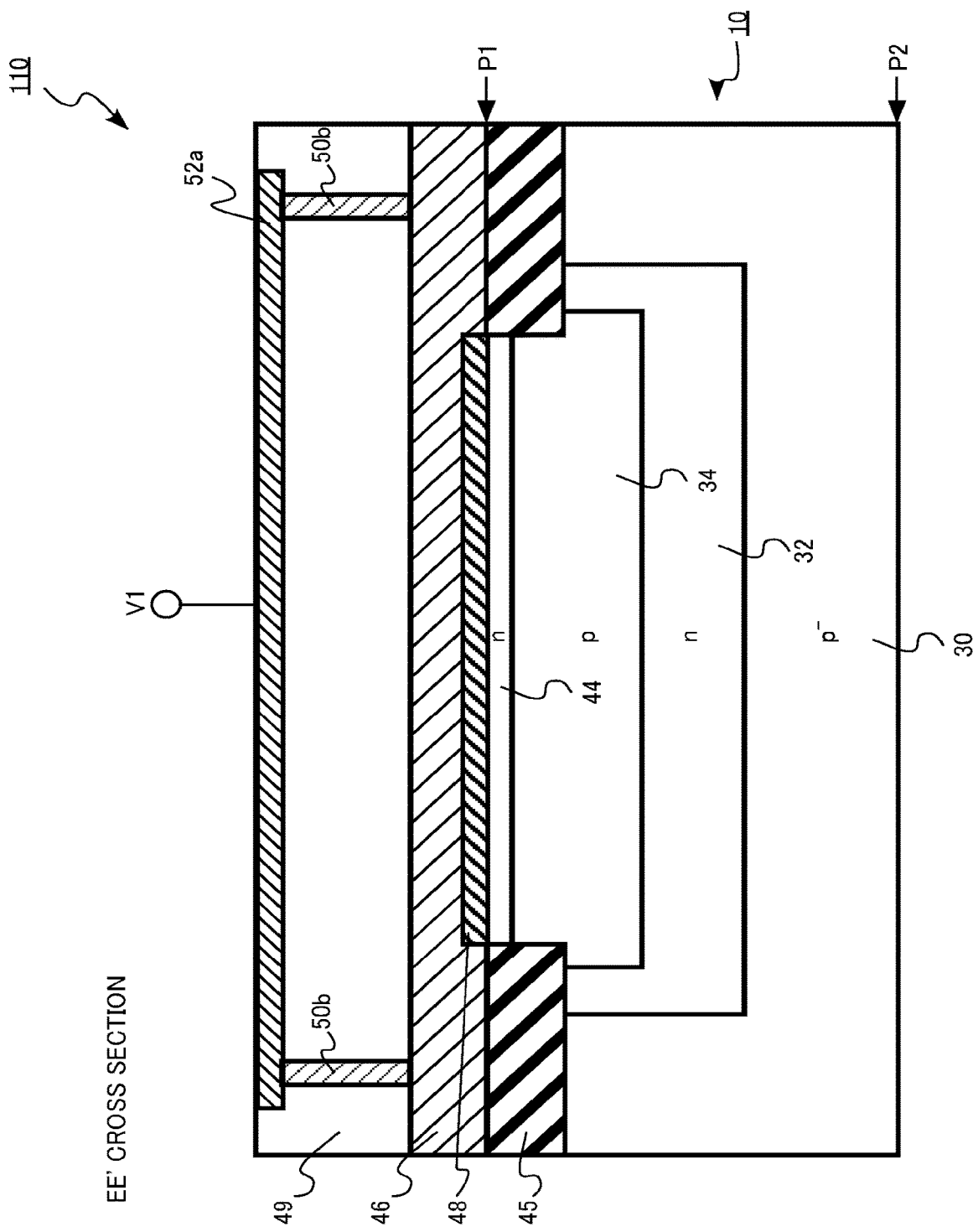
FIG. 11 is a schematic cross-sectional view of the second modification example of the semiconductor memory device of the first embodiment.

FIG. 10 is a pattern layout diagram of a second modification example of the semiconductor memory device of the first embodiment. FIG. 10 is a pattern layout diagram corresponding to FIG. 5. FIG. 11 is a schematic cross-sectional view of the second modification example of the semiconductor memory device of the first embodiment. FIG. 11 is an EE' cross section of FIG. 10.

A first capacitor 110 of the second modification example is different from the first capacitor 110 of the first embodiment in that the contact plug 50b is in contact with the first capacitor electrode 46 directly above the element isolation region 45. Similar to the first capacitor 110 of the first embodiment, in the first capacitor 110 of the second modification example, it is possible to increase the capacitance of the capacitor as compared with the comparative example.

As described above, according to the semiconductor memory device of the first embodiment, it is possible to increase the capacitance of the capacitor.

Second Embodiment

A semiconductor memory device of a second embodiment is different from the semiconductor memory device of the first embodiment in that the control circuit further includes a second capacitor and the second capacitor includes a semiconductor substrate, which includes a seventh semiconductor region of n-type provided between the first face and the first semiconductor region and spaced from the second semiconductor region and an eighth semiconductor region of p-type provided between the first face and the seventh semiconductor region and electrically connected to the first semiconductor region, a second electrode electrically connected to the seventh semiconductor region, and a second insulating film provided between the eighth semiconductor region and the second electrode and having a thickness smaller than that of the first insulating film. Hereinafter, the description of a part of the content overlapping the first embodiment may be omitted.

The semiconductor memory device of the second embodiment is a non-volatile memory 200. The non-volatile memory 200 of the second embodiment is a three-dimensional NAND flash memory in which a plurality of memory cells are three-dimensionally arranged. The non-volatile memory 200 is an example of the semiconductor memory device.

Figure 12:
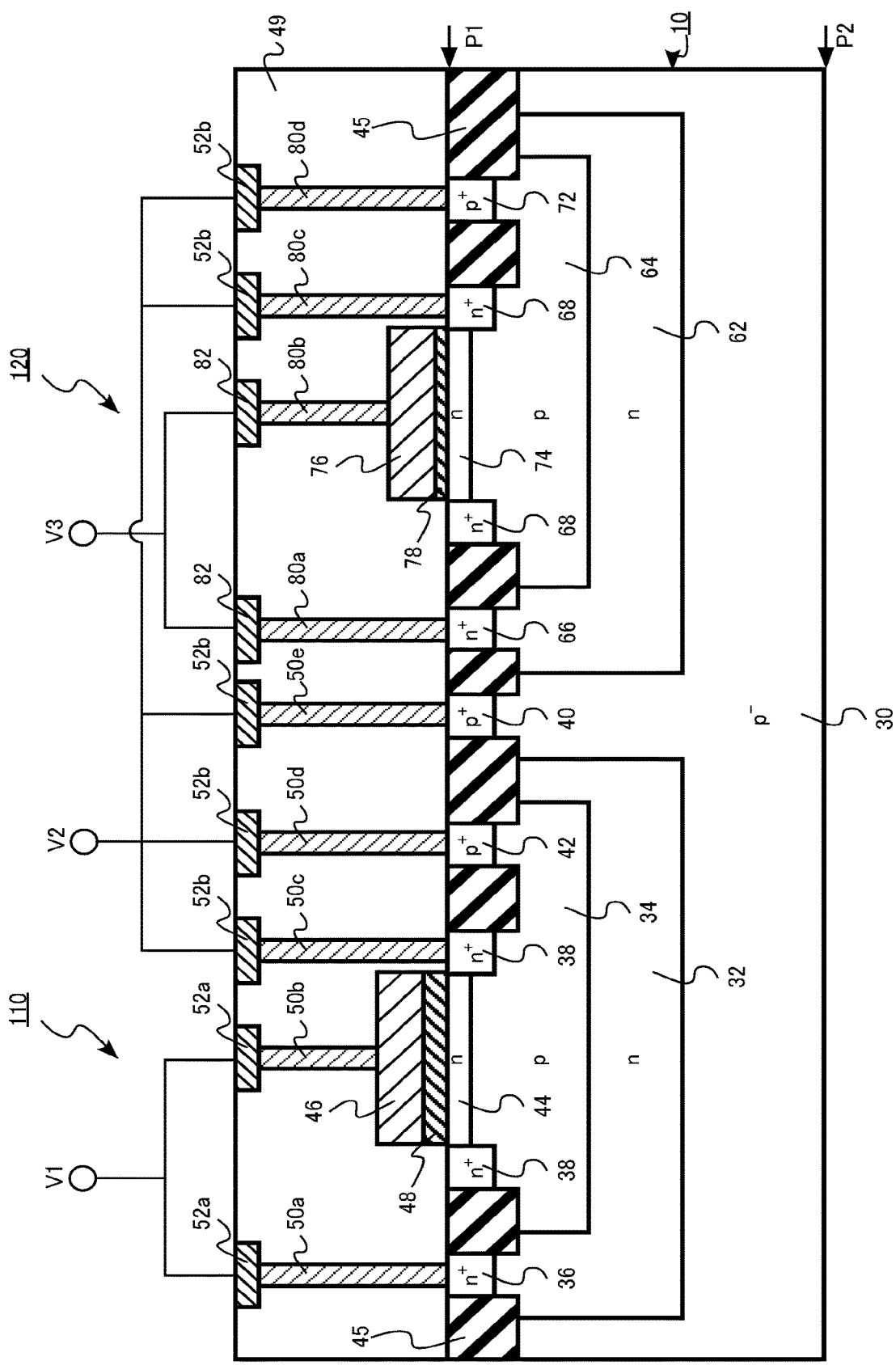
FIG. 12 is a schematic cross-sectional view of a semiconductor memory device of a second embodiment.

FIG. 12 is a schematic cross-sectional view of the semiconductor memory device of the second embodiment. FIG. 12 is a schematic cross-sectional view corresponding to FIG. 4. The non-volatile memory 200 includes a first capacitor 110 and a second capacitor 120.

FIG. 12 is a schematic cross-sectional view of the first capacitor 110 and the second capacitor 120 of the non-volatile memory 200. The first capacitor 110 is, for example, a capacitor included in the charge pump 106. The second capacitor is, for example, a capacitor included in the input/output circuit 107.

The first capacitor 110 includes a semiconductor substrate 10, an element isolation region 45, a first capacitor electrode 46, a first capacitor insulating film 48, an interlayer insulating layer 49, a contact plug 50a, a contact plug 50b, a contact plug 50c, a contact plug 50d, a contact plug 50e, a first wiring layer 52a, and a second wiring layer 52b. The semiconductor substrate 10 includes a p-type region 30, a first n-well 32, a first p-well 34, a first n-type contact region 36, a second n-type contact region 38, a first p-type contact region 40, a second p-type contact region 42, and a first n-type region 44.

The second capacitor 120 includes a semiconductor substrate 10, an element isolation region 45, a second capacitor electrode 76, a second capacitor insulating film 78, an interlayer insulating layer 49, a contact plug 80a, a contact plug 80b, a contact plug 80c, a contact plug 80d, a third wiring layer 82, and a second wiring layer 52b. The semiconductor substrate 10 includes a p-type region 30, a second n-well 62, a second p-well 64, a third n-type contact region 66, a fourth n-type contact region 68, a third p-type contact region 72, and a second n-type region 74.

The second n-well 62 is an example of a seventh semiconductor region. The second p-well 64 is an example of an eighth semiconductor region. The second capacitor electrode 76 is an example of a second electrode. The second capacitor insulating film 78 is an example of a second insulating film.

The first capacitor 110 and the second capacitor 120 share the semiconductor substrate 10 and the p-type region 30.

The second n-well 62, the second p-well 64, the third n-type contact region 66, the fourth n-type contact region 68, the third p-type contact region 72, and the second n-type region 74 have the same configurations as the first n-well 32, the first p-well 34, the first n-type contact region 36, the second n-type contact region 38, the second p-type contact region 42, and the first n-type region 44, respectively.

The second n-well 62 is spaced from the first n-well 32. The first n-well 32 and the second n-well 62 are electrically separated from each other.

The second capacitor electrode 76, the second capacitor insulating film 78, the contact plug 80a, the contact plug 80b, the contact plug 80c, the contact plug 80d, and the third wiring layer 82 have the same configurations as the first capacitor electrode 46, the first capacitor insulating film 48, the contact plug 50a, the contact plug 50b, the contact plug 50c, the contact plug 50d, and the first wiring layer 52a, respectively.

The thickness of the second capacitor insulating film 78 is smaller than the thickness of the first capacitor insulating film 48. The thickness of the first capacitor insulating film 48 is, for example, equal to or more than 2 nm and equal to or less than 7 nm.

A first voltage V1 is applied to the first wiring layer 52a. The first voltage V1 is applied to the first n-well 32 and the first capacitor electrode 46.

The first voltage V1 is, for example, a program voltage Vprog applied to the gate electrode of the memory cell MC when reading the data stored in the memory cell MC. The program voltage Vprog is, for example, equal to or more than 15 V and equal to or less than 30 V.

The first wiring layer 52a is electrically connected to, for example, the word line WL of the memory cell array 101. The first wiring layer 52a is electrically connected to the word line WL through, for example, the row decoder 103 and the word line driver 102. The word line WL is an example of the gate electrode of the memory cell MC.

The first wiring layer 52a is electrically connected to the first capacitor electrode 46. Therefore, the first capacitor electrode 46 is electrically connected to the word line WL.

A third voltage V3 is applied to the third wiring layer 82. The second capacitor electrode 76 and the second n-well 62 are electrically connected to the third wiring layer 82. Therefore, the third voltage V3 is applied to the second capacitor electrode 76 and the second n-well 62. The third voltage V3 is lower than the first voltage V1.

The third voltage V3 is, for example, a power supply voltage Vdd input from the outside. The power supply voltage Vdd is, for example, equal to or more than 1.5 V and equal to or less than 3 V.

The second wiring layer 52b is in contact with the contact plug 50c, the contact plug 50d, and the contact plug 50e, the contact plug 80c, and the contact plug 80d. The second n-type contact region 38, the first p-well 34, the p-type region 30, the fourth n-type contact region 68, and the second p-well 64 are electrically connected to each other by using the second wiring layer 52b, the contact plug 50c, the contact plug 50d, the contact plug 50e, the contact plug 80c, and the contact plug 80d.

A second voltage V2 is applied to the second wiring layer 52b. The second voltage V2 is applied to the second n-type contact region 38, the first p-well 34, the p-type region 30, the fourth n-type contact region 68, and the second p-well 64.

The first voltage V1 and the third voltage V3 are higher than the second voltage V2. The second voltage V2 is, for example, 0 V. The second wiring layer 52b is grounded, for example. The second wiring layer 52b is fixed to, for example, the ground potential.

According to the non-volatile memory 200 of the second embodiment, by reducing the thickness of the insulating film of the second capacitor 120 to which a voltage lower than that for the first capacitor 110 is applied, it is possible to increase the capacitance of the second capacitor 120 as compared with the first capacitor 110.

As described above, according to the semiconductor memory device of the second embodiment, it is possible to increase the capacitance of the capacitor.

Third Embodiment

A semiconductor memory device of a third embodiment is different from the semiconductor memory device of the first embodiment in that the first capacitor does not include the fourth semiconductor region and the fifth semiconductor region. Hereinafter, the description of a part of the content overlapping the first embodiment may be omitted.

The semiconductor memory device of the third embodiment is a non-volatile memory 300. The non-volatile memory 300 of the third embodiment is a three-dimensional NAND flash memory in which a plurality of memory cells are three-dimensionally arranged. The non-volatile memory 300 is an example of the semiconductor memory device.

Figure 13:
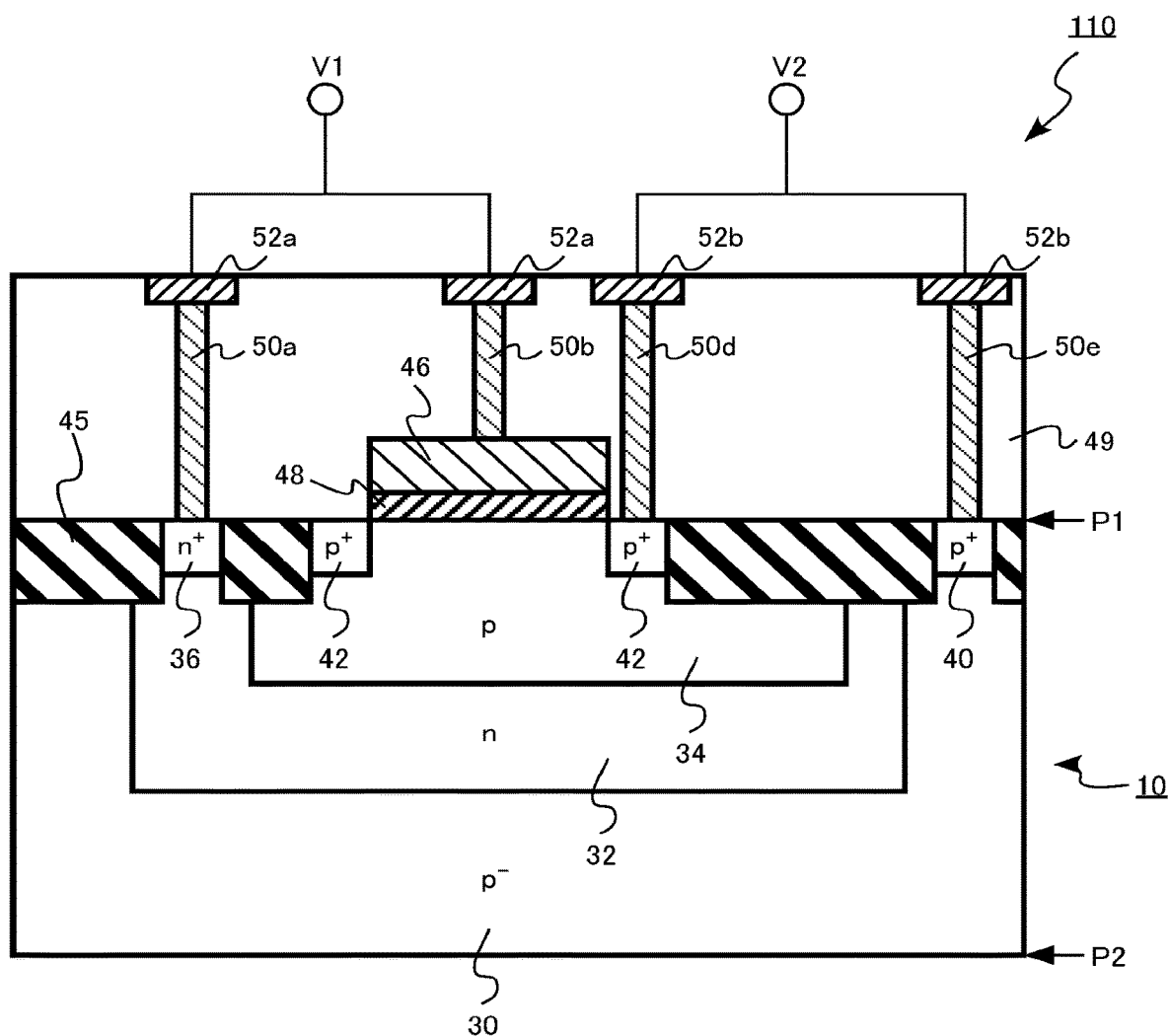
FIG. 13 is a schematic cross-sectional view of a semiconductor memory device of a third embodiment.
Figure 14:
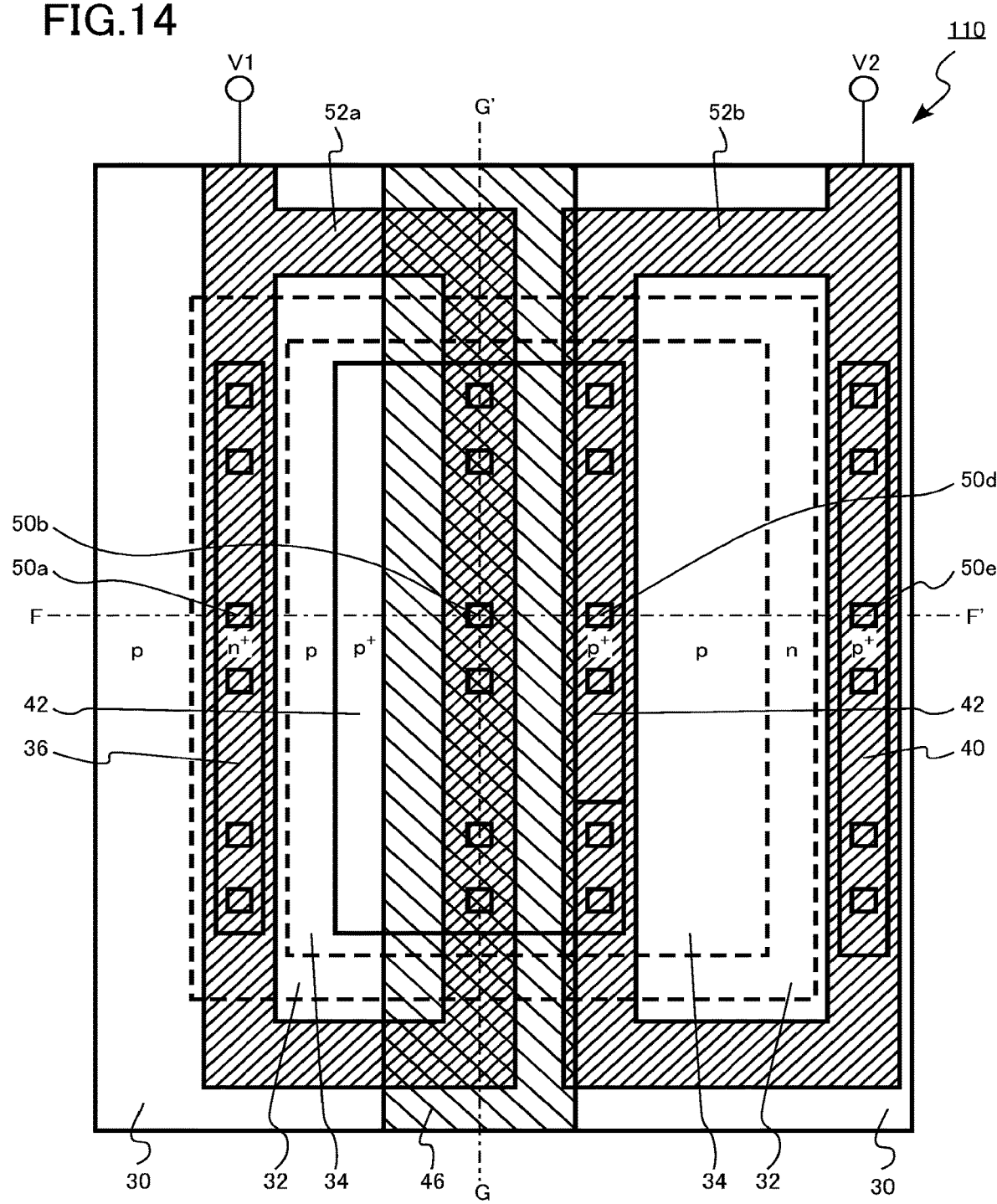
FIG. 14 is a pattern layout diagram of the semiconductor memory device of the third embodiment.
Figure 15:
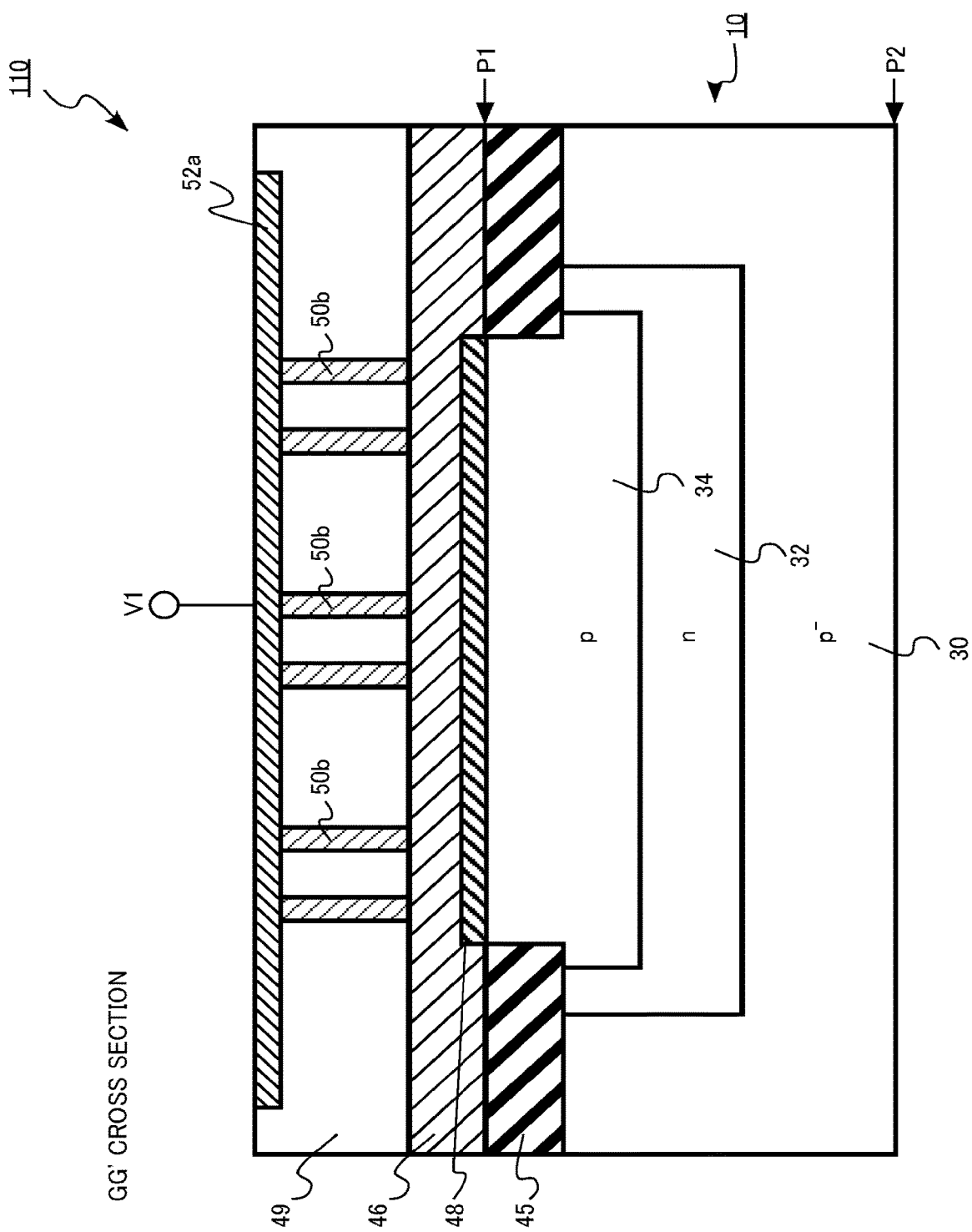
FIG. 15 is a schematic cross-sectional view of the semiconductor memory device of the third embodiment.

FIG. 13 is a schematic cross-sectional view of the semiconductor memory device of the third embodiment. FIG. 14 is a pattern layout diagram of the semiconductor memory device of the third embodiment. FIG. 15 is a schematic cross-sectional view of the semiconductor memory device of the third embodiment. FIG. 13 is an FF' cross section of FIG. 14. FIG. 15 is a GG' cross section of FIG. 14.

FIGS. 13, 14, and 15 are schematic diagrams of a first capacitor 110 of the non-volatile memory 300. The first capacitor 110 is, for example, a capacitor included in the charge pump 106 or the input/output circuit 107.

The first capacitor 110 includes a semiconductor substrate 10, an element isolation region 45, a first capacitor electrode 46, a first capacitor insulating film 48, an interlayer insulating layer 49, a contact plug 50a, a contact plug 50b, a contact plug 50d, a contact plug 50e, a first wiring layer 52a, and a second wiring layer 52b. The semiconductor substrate 10 includes a p-type region 30, a first n-well 32, a first p-well 34, a first n-type contact region 36, a first p-type contact region 40, and a second p-type contact region 42.

The p-type region 30 is an example of a first semiconductor region. The first n-well 32 is an example of a second semiconductor region. The first p-well 34 is an example of a third semiconductor region. The first capacitor electrode 46 is an example of a first electrode. The first capacitor insulating film 48 is an example of a first insulating film.

The p-type region 30 is a p$^-$-type semiconductor. The p-type region 30 is, for example, p-type single crystal silicon.

The first n-well 32 is provided between the first face P1 and the p-type region 30. The first n-well 32 is surrounded by, for example, the p-type region 30. The first n-well 32 is an n-type semiconductor. The first n-well 32 is, for example, n-type single crystal silicon.

The first p-well 34 is provided between the first face P1 and the first n-well 32. The first p-well 34 is surrounded by, for example, the first n-well 32. The first p-well 34 is a p-type semiconductor. The first p-well 34 is, for example, p-type single crystal silicon.

The first p-well 34 is electrically connected to the p-type region 30.

The first n-type contact region 36 is provided between the first face P1 and the first n-well 32. The first n-type contact region 36 is surrounded by, for example, the first n-well 32. The first n-type contact region 36 is an n$^+$-type semiconductor. The first n-type contact region 36 is, for example, n$^+$-type single crystal silicon.

The first p-type contact region 40 is provided between the first face P1 and the p-type region 30. The first p-type contact region 40 is surrounded by, for example, the p-type region 30. The first p-type contact region 40 is a p$^+$-type semiconductor. The first p-type contact region 40 is, for example, p$^+$-type single crystal silicon.

The first p-type contact region 40 is electrically connected to the second p-type contact region 42.

The second p-type contact region 42 is provided between the first face P1 and the first p-well 34. The second p-type contact region 42 is surrounded by, for example, the first p-well 34. The second p-type contact region 42 is provided at the end of the first capacitor electrode 46 on the side of the first p-well 34. For example, the second p-type contact regions 42 are provided in the first p-well 34 so as to be located on both sides of the first capacitor electrode 46 with the first capacitor electrode 46 interposed between the second p-type contact regions 42.

The second p-type contact region 42 is a p+-type semiconductor. The second p-type contact region 42 is, for example, p+-type single crystal silicon.

The second p-type contact region 42 is electrically connected to the first p-type contact region 40.

The element isolation region 45 is provided on the side of the first face P1 of the semiconductor substrate 10. The element isolation region 45 is provided, for example, between the first n-type contact region 36 and the second p-type contact region 42. The element isolation region 45 is provided, for example, between the second p-type contact region 42 and the first p-type contact region 40.

The element isolation region 45 is an insulator. The element isolation region 45 contains, for example, silicon oxide.

The first capacitor electrode 46 is provided on the side of the first face P1 of the semiconductor substrate 10. The first capacitor electrode 46 is provided above the first p-well 34. The first capacitor electrode 46 is a conductor.

The first capacitor electrode 46 is electrically connected to the first n-well 32 and the first n-type contact region 36.

The first capacitor insulating film 48 is provided between the first p-well 34 and the first capacitor electrode 46. The first capacitor insulating film 48 is in contact with the first p-well 34.

The first capacitor insulating film 48 is an insulator. The first capacitor insulating film 48 is, for example, an oxide, a nitride, or an oxynitride. The first capacitor insulating film 48 contains, for example, silicon oxide.

The interlayer insulating layer 49 is provided on the side of the first face P1 of the semiconductor substrate 10. The interlayer insulating layer 49 is provided on the first n-type contact region 36, the first p-type contact region 40, the second p-type contact region 42, the element isolation region 45, and the first capacitor electrode 46. The interlayer insulating layer 49 is an insulator.

The contact plug 50a, the contact plug 50b, the contact plug 50d, and the contact plug 50e are provided in the interlayer insulating layer 49. The contact plug 50a, the contact plug 50b, the contact plug 50d, and the contact plug 50e are conductors.

The contact plug 50a is in contact with the first n-type contact region 36. The contact plug 50b is in contact with the first capacitor electrode 46. The contact plug 50d is in contact with the second p-type contact region 42. The contact plug 50e is in contact with the first p-type contact region 40.

The first wiring layer 52a and the second wiring layer 52b are provided in the interlayer insulating layer 49. The first wiring layer 52a and the second wiring layer 52b are conductors. The first wiring layer 52a and the second wiring layer 52b are, for example, metal.

The first wiring layer 52a is in contact with the contact plug 50a and the contact plug 50b. The first n-well 32 and the first capacitor electrode 46 are electrically connected to each other by using the first wiring layer 52a, the contact plug 50a, and the contact plug 50b.

A first voltage V1 is applied to the first wiring layer 52a. The first voltage V1 is applied to the first n-well 32 and the first capacitor electrode 46.

The first voltage V1 is, for example, a program voltage Vprog applied to the gate electrode of the memory cell MC when reading the data stored in the memory cell MC. The program voltage Vprog is, for example, equal to or more than 20 V and equal to or less than 30 V. The first voltage V1 is, for example, a power supply voltage Vdd input from the outside. The power supply voltage Vdd is, for example, equal to or more than 1.5 V and equal to or less than 3 V.

The first wiring layer 52a is electrically connected to, for example, the word line WL of the memory cell array 101. The first wiring layer 52a is electrically connected to the word line WL through, for example, the row decoder 103 and the word line driver 102. The word line WL is an example of the gate electrode of the memory cell MC.

The first capacitor electrode 46 is electrically connected to the first wiring layer 52a. Therefore, the first capacitor electrode 46 is electrically connected to the word line WL.

The second wiring layer 52b is in contact with the contact plug 50d and the contact plug 50e. The first p-well 34 and the p-type region 30 are electrically connected to each other by using the second wiring layer 52b, the contact plug 50d, and the contact plug 50e.

A second voltage V2 is applied to the second wiring layer 52b. The second voltage V2 is applied to the first p-well 34 and the p-type region 30.

The first voltage V1 is higher than the second voltage V2. The second voltage V2 is, for example, 0 V. The second wiring layer 52b is grounded, for example. The second wiring layer 52b is fixed to, for example, the ground potential.

Similar to the first capacitor 110 of the non-volatile memory 100 of the first embodiment, the first capacitor 110 of the non-volatile memory 300 of the third embodiment has, as its capacitance, not only the insulating film capacitance Cox but also the junction capacitance Cnwell/pwell between the first n-well 32 and the first p-well 34 and the junction capacitance Cnwell/psub between the first n-well 32 and the p-type region 30 in parallel. Therefore, according to the non-volatile memory 300 of the third embodiment, it is possible to increase the capacitance of the capacitor.

In addition, as the insulating film capacitance Cox of the first capacitor 110 of the non-volatile memory 300, a capacitance between the first capacitor electrode 46 and an inversion layer formed in the first p-well 34 is used.

As described above, according to the semiconductor memory device of the third embodiment, it is possible to increase the capacitance of the capacitor.

Fourth Embodiment

A semiconductor memory device of a fourth embodiment is different from the semiconductor memory device of the first embodiment in that, in the first capacitor, the semiconductor substrate further includes a sixth semiconductor region of p-type provided between the first face and the second semiconductor region, spaced from the third semiconductor region, and electrically connected to the first semiconductor region and the third semiconductor region. Hereinafter, the description of a part of the content overlapping the first embodiment may be omitted.

The semiconductor memory device of the fourth embodiment is a non-volatile memory 400. The non-volatile memory 400 of the fourth embodiment is a three-dimensional NAND flash memory in which a plurality of memory cells are three-dimensionally arranged. The non-volatile memory 400 is an example of the semiconductor memory device.

Figure 16:
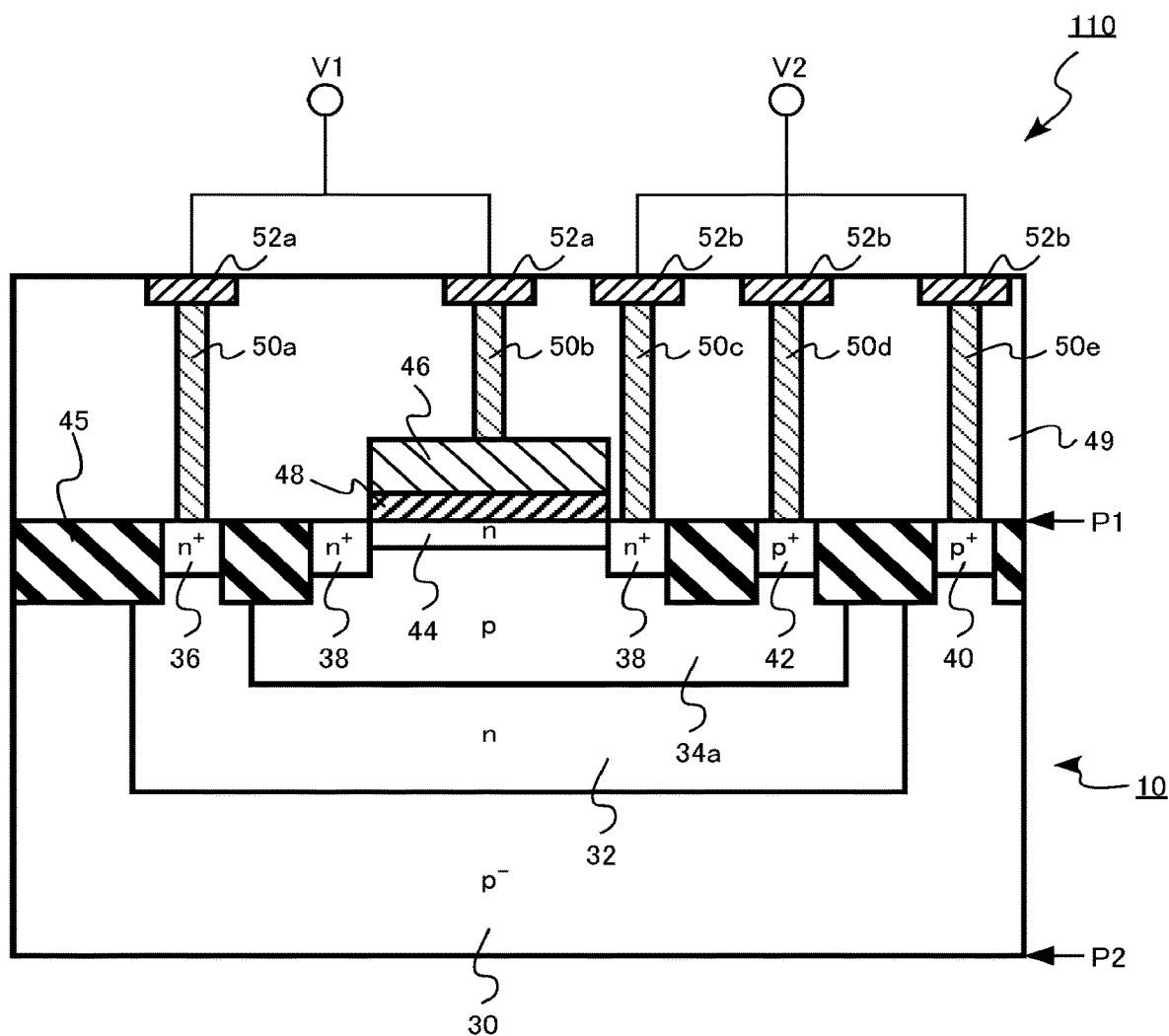
FIG. 16 is a schematic cross-sectional view of a semiconductor memory device of a fourth embodiment.
Figure 17:
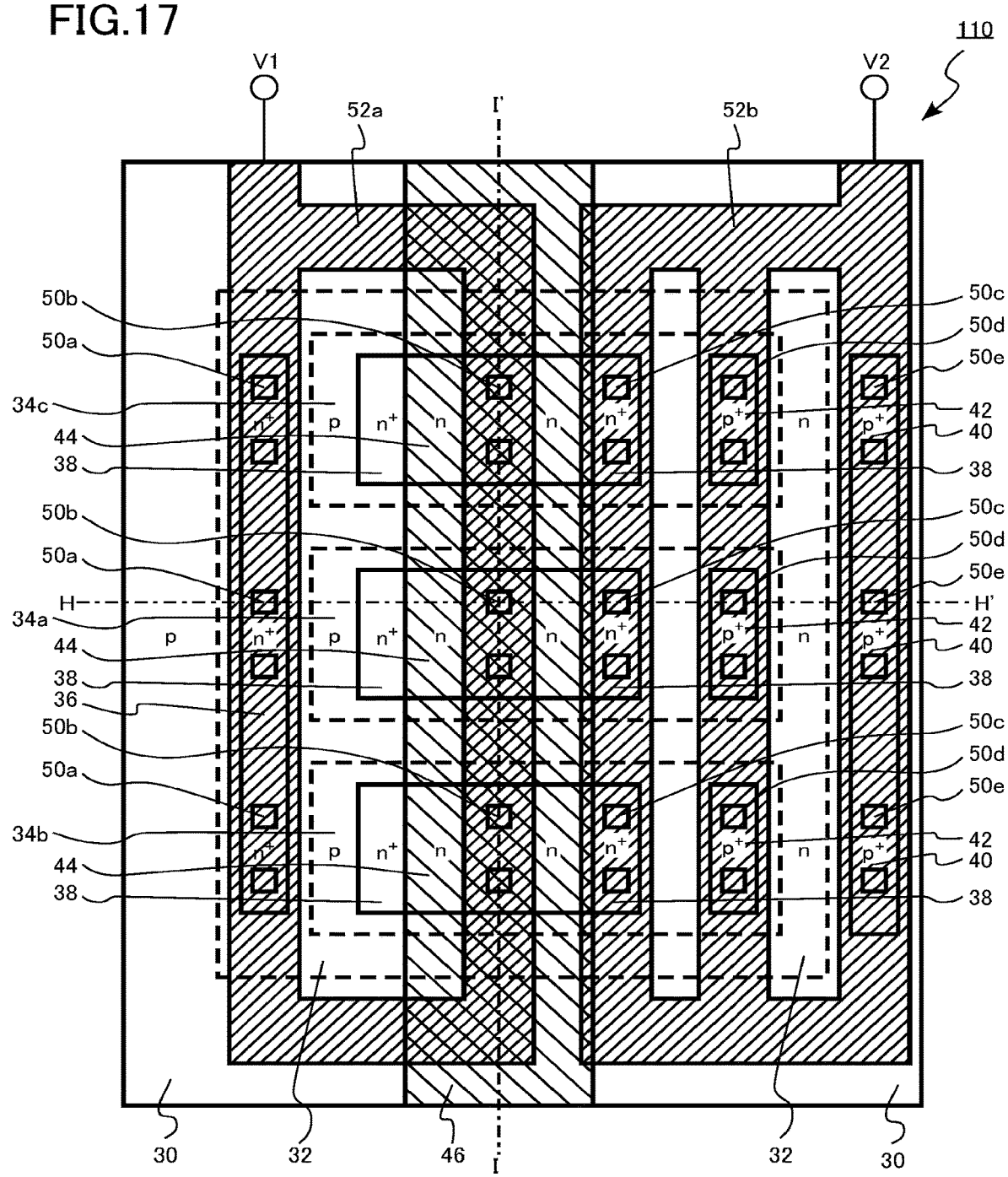
FIG. 17 is a pattern layout diagram of the semiconductor memory device of the fourth embodiment.
Figure 18:
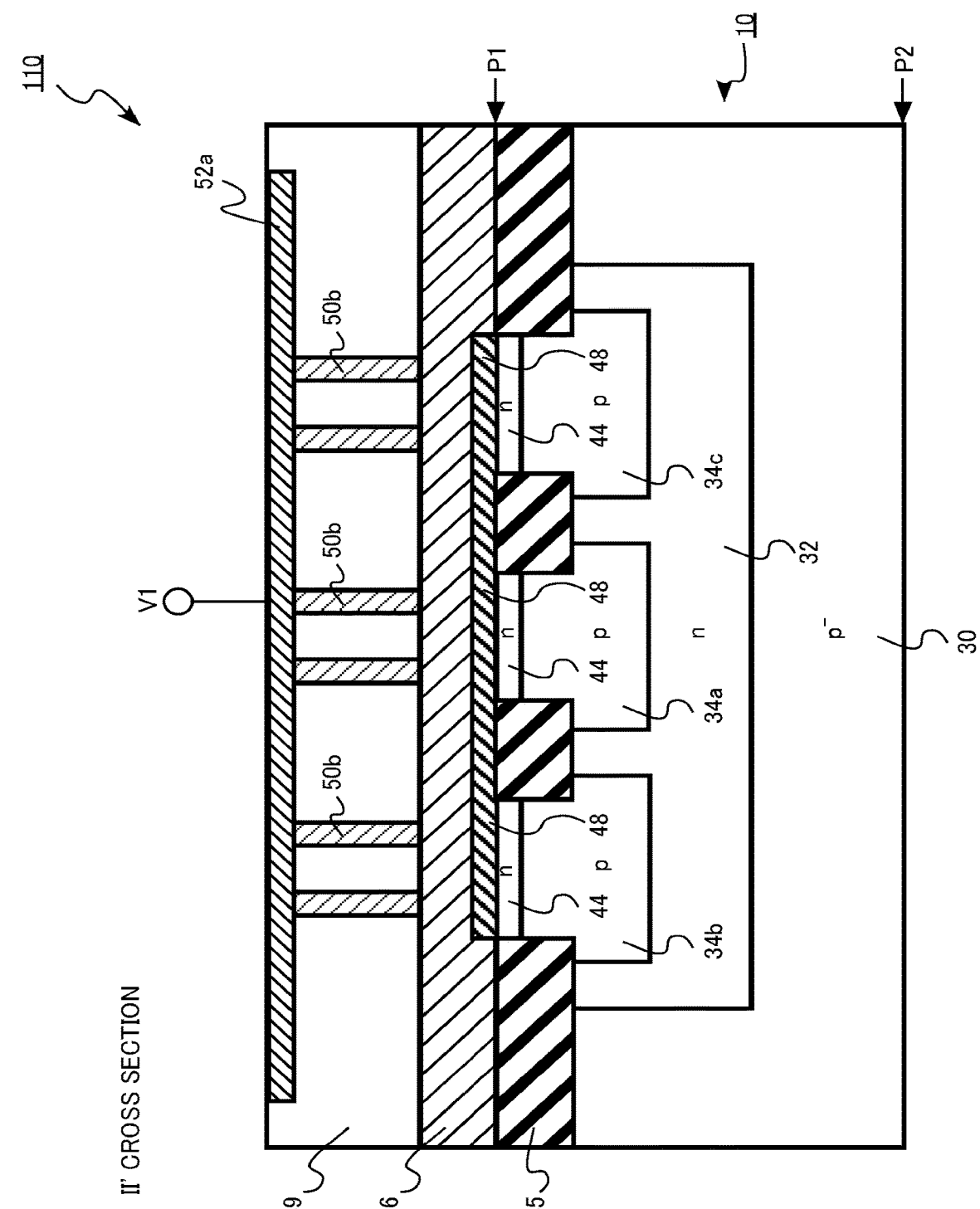
FIG. 18 is a schematic cross-sectional view of the semiconductor memory device of the fourth embodiment.

FIG. 16 is a schematic cross-sectional view of the semiconductor memory device of the fourth embodiment. FIG. 17 is a pattern layout diagram of the semiconductor memory device of the fourth embodiment. FIG. 18 is a schematic cross-sectional view of the semiconductor memory device of the fourth embodiment. FIG. 16 is an HH' cross section of FIG. 17. FIG. 18 is an II' cross section of FIG. 17.

FIGS. 16, 17, and 18 are schematic diagrams of a first capacitor 110 of the non-volatile memory 400. The first capacitor 110 is, for example, a capacitor included in the charge pump 106 or the input/output circuit 107.

The first capacitor 110 includes a semiconductor substrate 10, an element isolation region 45, a first capacitor electrode 46, a first capacitor insulating film 48, an interlayer insulating layer 49, a contact plug 50a, a contact plug 50b, a contact plug 50c, a contact plug 50d, a contact plug 50e, a first wiring layer 52a, and a second wiring layer 52b. The semiconductor substrate 10 includes a p-type region 30, a first n-well 32, a first p-well 34a, a first p-well 34b, a first p-well 34c, a first n-type contact region 36, a second n-type contact region 38, a first p-type contact region 40, a second p-type contact region 42, and a first n-type region 44.

The p-type region 30 is an example of a first semiconductor region. The first n-well 32 is an example of a second semiconductor region. The first p-well 34a is an example of a third semiconductor region. The first p-well 34b is an example of a sixth semiconductor region. The second n-type contact region 38 is an example of a fourth semiconductor region. The first n-type region 44 is an example of a fifth semiconductor region. The first capacitor electrode 46 is an example of a first electrode. The first capacitor insulating film 48 is an example of a first insulating film.

The p-type region 30 is a $p^-$-type semiconductor. The p-type region 30 is, for example, p-type single crystal silicon.

The first n-well 32 is provided between the first face P1 and the p-type region 30. The first n-well 32 is surrounded by, for example, the p-type region 30. The first n-well 32 is an n-type semiconductor. The first n-well 32 is, for example, n-type single crystal silicon.

The first p-well 34a, the first p-well 34b, and the first p-well 34c are provided between the first face P1 and the first n-well 32. The first p-well 34a, the first p-well 34b, and the first p-well 34c are spaced from each other with the first n-well 32 interposed therebetween.

For example, each of the first p-well 34a, the first p-well 34b, and the first p-well 34c is surrounded by the first n-well 32.

The first p-well 34a, the first p-well 34b, and the first p-well 34c are p-type semiconductors. The first p-well 34a, the first p-well 34b, and the first p-well 34c are, for example, p-type single crystal silicon.

The first p-well 34a, the first p-well 34b, and the first p-well 34c are electrically connected to the p-type region 30.

The first n-type contact region 36 is provided between the first face P1 and the first n-well 32. The first n-type contact region 36 is surrounded by, for example, the first n-well 32. The first n-type contact region 36 is an $n^+$-type semiconductor. The first n-type contact region 36 is, for example, $n^+$-type single crystal silicon.

The second n-type contact region 38 is provided between the first face P1 and each of the first p-well 34a, the first p-well 34b, and the first p-well 34c. The second n-type contact region 38 is provided at the end of the first capacitor electrode 46. For example, the second n-type contact regions 38 are provided on both sides of the first capacitor electrode 46 with the first capacitor electrode 46 interposed between the second n-type contact regions 38.

The second n-type contact region 38 is electrically connected to the first p-well 34a, the first p-well 34b, the first p-well 34c, and the p-type region 30.

The first p-type contact region 40 is provided between the first face P1 and the p-type region 30. The first p-type contact region 40 is surrounded by, for example, the p-type region 30. The first p-type contact region 40 is a $p^+$-type semiconductor. The first p-type contact region 40 is, for example, $p^+$-type single crystal silicon.

The first p-type contact region 40 is electrically connected to the second n-type contact region 38 and the second p-type contact region 42.

The second p-type contact region 42 is provided between the first face P1 and each of the first p-well 34a, the first p-well 34b, and the first p-well 34c. The second p-type contact region 42 is a $p^+$-type semiconductor. The second p-type contact region 42 is, for example, $p^+$-type single crystal silicon.

The second p-type contact region 42 is electrically connected to the second n-type contact region 38, the first p-type contact region 40, and the p-type region 30.

The first n-type region 44 is provided between the first face P1 and each of the first p-well 34a, the first p-well 34b, and the first p-well 34c. The first n-type region 44 is provided between the first capacitor insulating film 48 and each of the first p-well 34a, the first p-well 34b, and the first p-well 34c. The first re-type region 44 is in contact with the second n-type contact region 38. The first n-type region 44 is in contact with, for example, the first capacitor insulating film 48.

The first n-type region 44 is an n-type semiconductor. The first n-type region 44 is, for example, n-type single crystal silicon.

The element isolation region 45 is provided on the side of the first face P1 of the semiconductor substrate 10. The element isolation region 45 is provided, for example, between the first n-type contact region 36 and the second n-type contact region 38. The element isolation region 45 is provided, for example, between the second n-type contact region 38 and the second p-type contact region 42. The element isolation region 45 is provided, for example, between the second p-type contact region 42 and the first p-type contact region 40.

The element isolation region 45 is an insulator. The element isolation region 45 contains, for example, silicon oxide.

The first capacitor electrode 46 is provided on the side of the first face P1 of the semiconductor substrate 10. The first capacitor electrode 46 is provided above each of the first p-well 34a, the first p-well 34b, and the first p-well 34c. The first capacitor electrode 46 is provided above the first n-type region 44.

The first capacitor electrode 46 is a conductor. The first capacitor electrode 46 is, for example, a semiconductor, a metal semiconductor compound, or a metal. The first capacitor electrode 46 is, for example, polycrystalline silicon containing n-type impurities or p-type impurities.

The first capacitor electrode 46 is electrically connected to the first n-well 32 and the first n-type contact region 36.

The first capacitor insulating film 48 is provided between the first capacitor electrode 46 and each of the first p-well 34a, the first p-well 34b, and the first p-well 34c. The first capacitor insulating film 48 is provided, for example, between the first n-type region 44 and the first capacitor electrode 46.

The first capacitor insulating film 48 is an insulator. The first capacitor insulating film 48 is, for example, an oxide, a nitride, or an oxynitride. The first capacitor insulating film 48 contains, for example, silicon oxide.

The interlayer insulating layer 49 is provided on the side of the first face P1 of the semiconductor substrate 10. The interlayer insulating layer 49 is provided on the first n-type contact region 36, the second n-type contact region 38, the first p-type contact region 40, the second p-type contact region 42, the element isolation region 45, and the first capacitor electrode 46.

The contact plug 50a, the contact plug 50b, the contact plug 50c, the contact plug 50d, and the contact plug 50e are provided in the interlayer insulating layer 49. The contact plug 50a, the contact plug 50b, the contact plug 50c, the contact plug 50d, and the contact plug 50e are conductors.

The contact plug 50a is in contact with the first n-type contact region 36. The contact plug 50b is in contact with the first capacitor electrode 46. The contact plug 50c is in contact with the second n-type contact region 38. The contact plug 50d is in contact with the second p-type contact region 42. The contact plug 50e is in contact with the first p-type contact region 40.

The first wiring layer 52a and the second wiring layer 52b are provided in the interlayer insulating layer 49. The first wiring layer 52a and the second wiring layer 52b are conductors. The first wiring layer 52a and the second wiring layer 52b are, for example, metal.

The first wiring layer 52a is in contact with the contact plug 50a and the contact plug 50b. The first n-well 32 and the first capacitor electrode 46 are electrically connected to each other by using the first wiring layer 52a, the contact plug 50a, and the contact plug 50b.

A first voltage V1 is applied to the first wiring layer 52a. The first voltage V1 is applied to the first n-well 32 and the first capacitor electrode 46.

The second wiring layer 52b is in contact with the contact plug 50c, the contact plug 50d, and the contact plug 50e. The second n-type contact region 38, the first p-well 34a, the first p-well 34b, the first p-well 34c, and the p-type region 30 are electrically connected to each other by using the second wiring layer 52b, the contact plug 50c, the contact plug 50d, and the contact plug 50e.

A second voltage V2 is applied to the second wiring layer 52b. The second voltage V2 is applied to the second n-type contact region 38, the first p-well 34, and the p-type region 30.

The first voltage V1 is higher than the second voltage V2. The second voltage V2 is, for example, 0 V. The second wiring layer 52b is grounded, for example. The second wiring layer 52b is fixed to, for example, the ground potential.

Similar to the first capacitor 110 of the non-volatile memory 100 of the first embodiment, the first capacitor 110 of the non-volatile memory 400 of the fourth embodiment has, as its capacitance, not only the insulating film capacitance Cox but also the junction capacitance Cnwell/pwell between the first n-well 32 and each of the first p-well 34a, the first p-well 34b, and the first p-well 34c and the junction capacitance Cnwell/psub between the first n-well 32 and the p-type region 30 in parallel. Then, as the junction capacitance Cnwell/pwell, the capacitance of side surface portions of the first p-well 34a, the first p-well 34b, and the first p-well 34c can be used. Accordingly, the junction capacitance Cnwell/pwell increases. Therefore, according to the non-volatile memory 400 of the fourth embodiment, it is possible to increase the capacitance of the capacitor.

In FIGS. 16 to 18, a case where three first p-wells are provided in the first n-well 32 has been described as an example. However, the number of first p-wells may be 2 or may be equal to or more than 4.

As described above, according to the semiconductor memory device of the fourth embodiment, it is possible to increase the capacitance of the capacitor.

Fifth Embodiment

A semiconductor memory device of a fifth embodiment is different from the semiconductor memory device of the third embodiment in that, in the first capacitor, the semiconductor substrate further includes a sixth semiconductor region of p-type provided between the first face and the second semiconductor region, spaced from the third semiconductor region, and electrically connected to the first semiconductor region and the third semiconductor region. Hereinafter, the description of a part of the content overlapping the first and third embodiments may be omitted.

The semiconductor memory device of the fifth embodiment is a non-volatile memory 500. The non-volatile memory 500 of the fifth embodiment is a three-dimensional NAND flash memory in which a plurality of memory cells are three-dimensionally arranged. The non-volatile memory 500 is an example of the semiconductor memory device.

Figure 19:
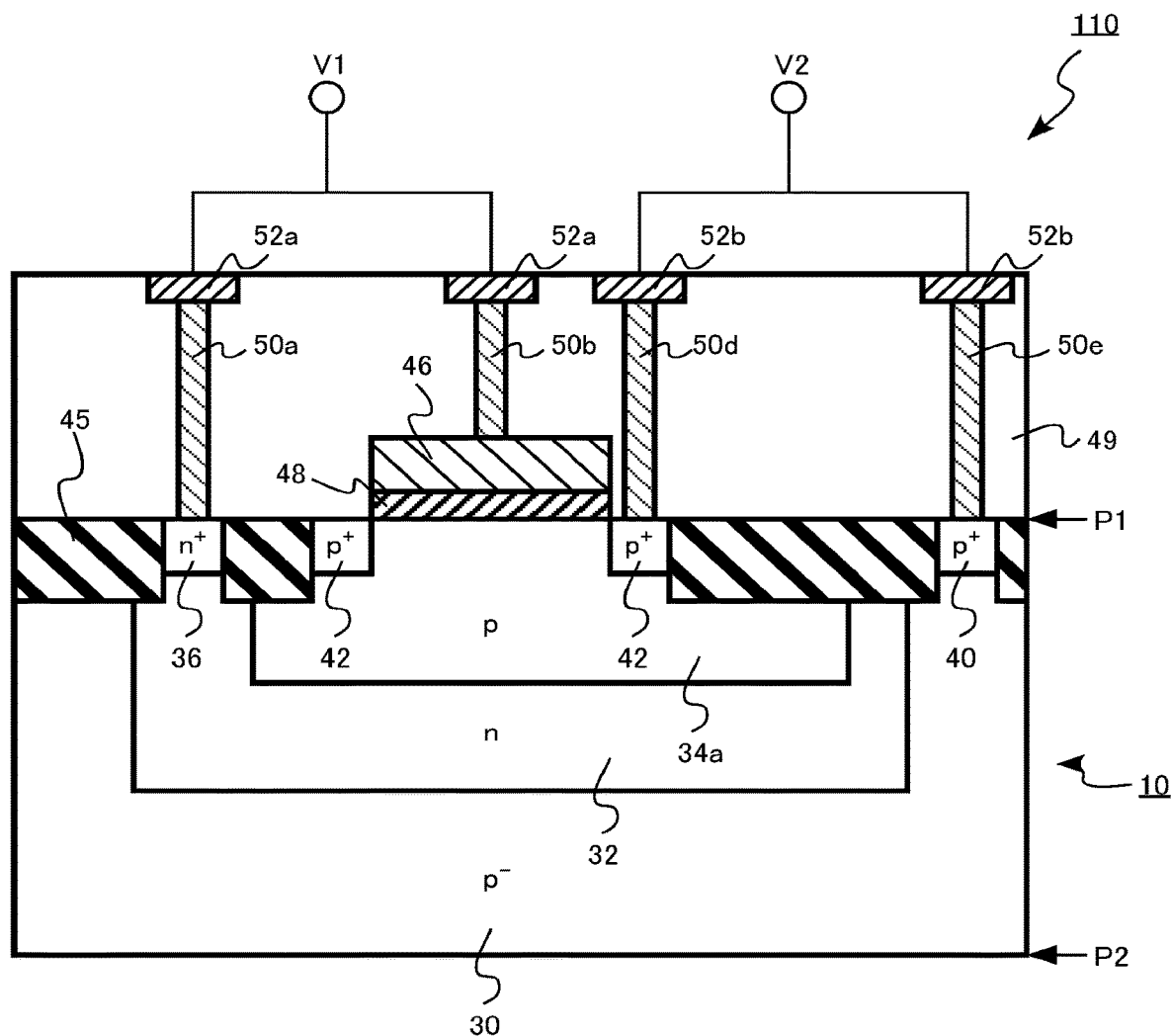
FIG. 19 is a schematic cross-sectional view of a semiconductor memory device of a fifth embodiment.
Figure 20:
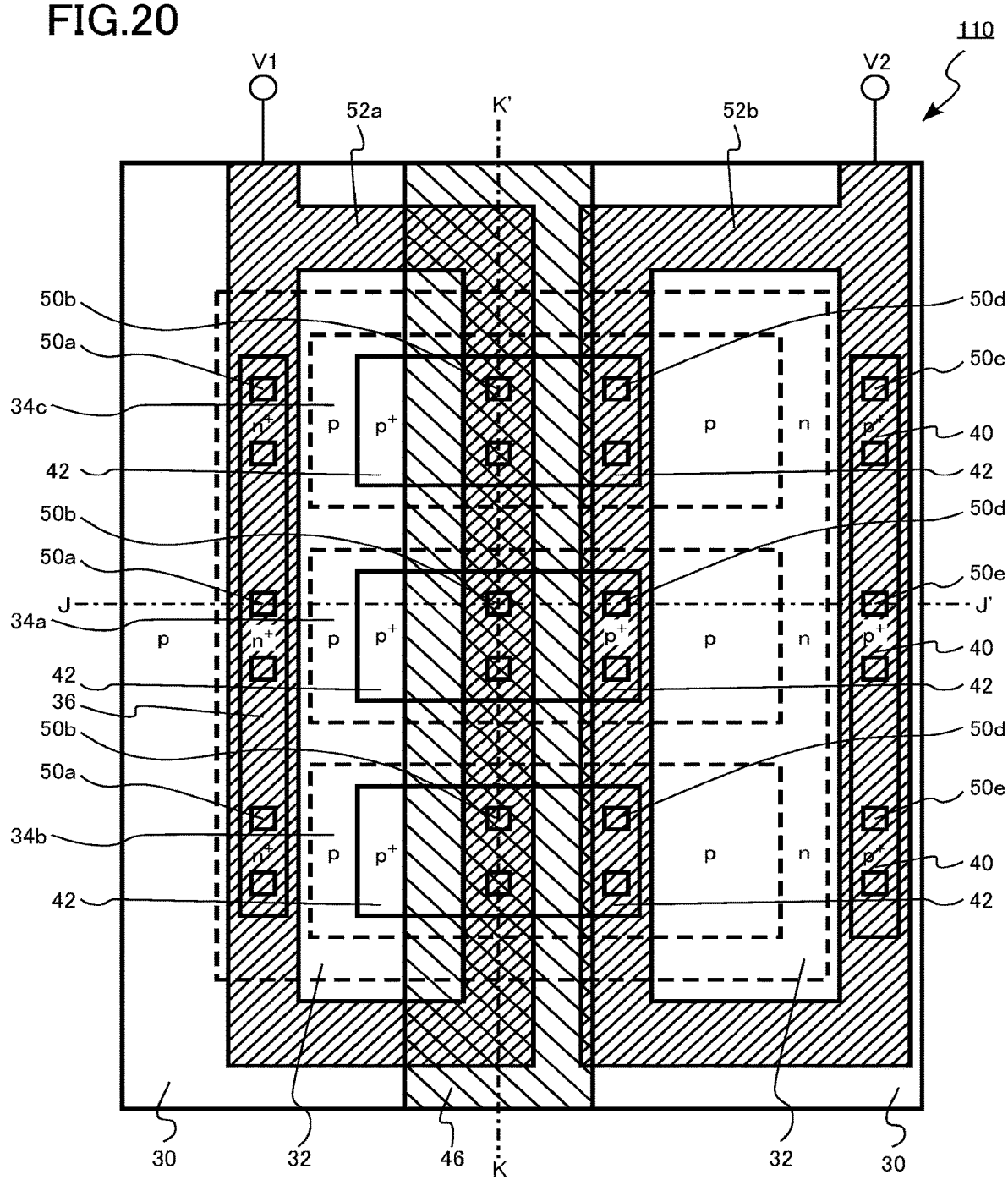
FIG. 20 is a pattern layout diagram of the semiconductor memory device of the fifth embodiment.
Figure 21:
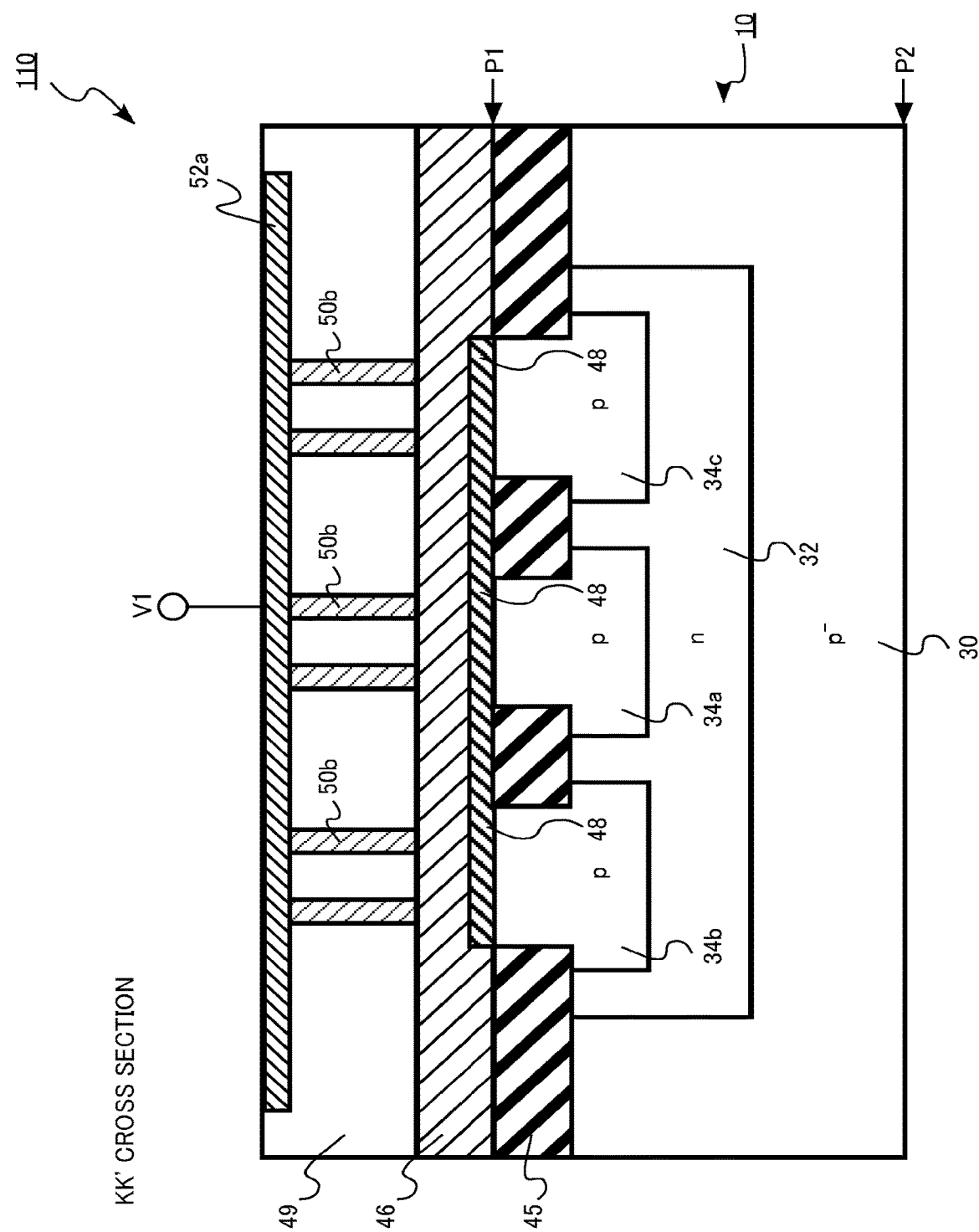
FIG. 21 is a schematic cross-sectional view of the semiconductor memory device of the fifth embodiment.

FIG. 19 is a schematic cross-sectional view of the semiconductor memory device of the fifth embodiment. FIG. 20 is a pattern layout diagram of the semiconductor memory device of the fifth embodiment. FIG. 21 is a schematic cross-sectional view of the semiconductor memory device of the fifth embodiment. FIG. 19 is a JJ' cross section of FIG. 20. FIG. 21 is a KK' cross section of FIG. 20.

FIGS. 19, 20, and 21 are schematic diagrams of the first capacitor 110 of the non-volatile memory 500. The first capacitor 110 is, for example, a capacitor included in the charge pump 106 or the input/output circuit 107.

The first capacitor 110 includes a semiconductor substrate 10, an element isolation region 45, a first capacitor electrode 46, a first capacitor insulating film 48, an interlayer insulating layer 49, a contact plug 50a, a contact plug 50b, a contact plug 50d, a contact plug 50e, a first wiring layer 52a, and a second wiring layer 52b. The semiconductor substrate 10 includes a p-type region 30, a first n-well 32, a first p-well 34a, a first p-well 34b, a first p-well 34c, a first n-type contact region 36, a first p-type contact region 40, and a second p-type contact region 42.

The p-type region 30 is an example of a first semiconductor region. The first n-well 32 is an example of a second semiconductor region. The first p-well 34a is an example of a third semiconductor region. The first p-well 34b is an example of a sixth semiconductor region. The first capacitor electrode 46 is an example of a first electrode. The first capacitor insulating film 48 is an example of a first insulating film.

The p-type region 30 is a p⁻-type semiconductor. The p-type region 30 is, for example, p-type single crystal silicon.

The first n-well 32 is provided between the first face P1 and the p-type region 30. The first n-well 32 is surrounded by, for example, the p-type region 30. The first n-well 32 is an n-type semiconductor. The first n-well 32 is, for example, n-type single crystal silicon.

The first p-well 34a, the first p-well 34b, and the first p-well 34c are provided between the first face P1 and the first n-well 32. The first p-well 34a, the first p-well 34b, and the first p-well 34c are spaced from each other with the first n-well 32 interposed therebetween. Each of the first p-well 34a, the first p-well 34b, and the first p-well 34c is surrounded by the first n-well 32.

The first p-well 34a, the first p-well 34b, and the first p-well 34c are p-type semiconductors. The first p-well 34a, the first p-well 34b, and the first p-well 34c are, for example, p-type single crystal silicon.

The first p-well 34a, the first p-well 34b, and the first p-well 34c are electrically connected to the p-type region 30.

The first n-type contact region 36 is provided between the first face P1 and the first n-well 32. The first n-type contact region 36 is surrounded by, for example, the first n-well 32. The first n-type contact region 36 is an n$^+$-type semiconductor. The first n-type contact region 36 is, for example, n$^+$-type single crystal silicon.

The first p-type contact region 40 is provided between the first face P1 and the p-type region 30. The first p-type contact region 40 is surrounded by, for example, the p-type region 30. The first p-type contact region 40 is a p$^+$-type semiconductor. The first p-type contact region 40 is, for example, p$^+$-type single crystal silicon.

The first p-type contact region 40 is electrically connected to the second p-type contact region 42.

The second p-type contact region 42 is provided between the first face P1 and each of the first p-well 34a, the first p-well 34b, and the first p-well 34c. The second p-type contact region 42 is provided at the end of the first capacitor electrode 46. For example, the second p-type contact regions 42 are provided on both sides of the first capacitor electrode 46 with the first capacitor electrode 46 interposed between the second p-type contact regions 42.

The second p-type contact region 42 is a p$^+$-type semiconductor. The second p-type contact region 42 is, for example, p$^+$-type single crystal silicon.

The second p-type contact region 42 is electrically connected to the first p-type contact region 40.

The element isolation region 45 is provided on the side of the first face P1 of the semiconductor substrate 10. The element isolation region 45 is provided, for example, between the first n-type contact region 36 and the second p-type contact region 42. The element isolation region 45 is provided, for example, between the second p-type contact region 42 and the first p-type contact region 40.

The element isolation region 45 is an insulator. The element isolation region 45 contains, for example, silicon oxide.

The first capacitor electrode 46 is provided above each of the first p-well 34a, the first p-well 34b, and the first p-well 34c. The first capacitor electrode 46 is a conductor.

The first capacitor electrode 46 is electrically connected to the first n-well 32 and the first n-type contact region 36.

The first capacitor insulating film 48 is provided between the first capacitor electrode 46 and each of the first p-well 34a, the first p-well 34b, and the first p-well 34c. The first capacitor insulating film 48 is in contact with the first p-well 34a, the first p-well 34b, and the first p-well 34c.

The first capacitor insulating film 48 is an insulator. The first capacitor insulating film 48 is, for example, an oxide, a nitride, or an oxynitride. The first capacitor insulating film 48 contains, for example, silicon oxide.

The interlayer insulating layer 49 is provided on the side of the first face P1 of the semiconductor substrate 10. The interlayer insulating layer 49 is provided on the first n-type contact region 36, the first p-type contact region 40, the second p-type contact region 42, the element isolation region 45, and the first capacitor electrode 46. The interlayer insulating layer 49 is an insulator.

The contact plug 50a, the contact plug 50b, the contact plug 50d, and the contact plug 50e are provided in the interlayer insulating layer 49. The contact plug 50a, the contact plug 50b, the contact plug 50d, and the contact plug 50e are conductors.

The contact plug 50a is in contact with the first n-type contact region 36. The contact plug 50b is in contact with the first capacitor electrode 46. The contact plug 50d is in contact with the second p-type contact region 42. The contact plug 50e is in contact with the first p-type contact region 40.

The first wiring layer 52a and the second wiring layer 52b are provided in the interlayer insulating layer 49. The first wiring layer 52a and the second wiring layer 52b are conductors. The first wiring layer 52a and the second wiring layer 52b are, for example, metal.

The first wiring layer 52a is in contact with the contact plug 50a and the contact plug 50b. The first n-well 32 and the first capacitor electrode 46 are electrically connected to each other by using the first wiring layer 52a, the contact plug 50a, and the contact plug 50b.

A first voltage V1 is applied to the first wiring layer 52a. The first voltage V1 is applied to the first n-well 32 and the first capacitor electrode 46.

The first capacitor electrode 46 is electrically connected to the first wiring layer 52a. Therefore, the first capacitor electrode 46 is electrically connected to the word line WL.

The second wiring layer 52b is in contact with the contact plug 50d and the contact plug 50e. The first p-well 34a, the first p-well 34b, the first p-well 34c, and the p-type region 30 are electrically connected to each other by using the second wiring layer 52b, the contact plug 50d, and the contact plug 50e.

A second voltage V2 is applied to the second wiring layer 52b. The second voltage V2 is applied to the first p-well 34a, the first p-well 34b, the first p-well 34c, and the p-type region 30.

The first voltage V1 is higher than the second voltage V2. The second voltage V2 is, for example, 0 V. The second wiring layer 52b is grounded, for example. The second wiring layer 52b is fixed to, for example, the ground potential.

Similar to the first capacitor 110 of the non-volatile memory 300 of the third embodiment, the first capacitor 110 of the non-volatile memory 500 of the fifth embodiment has, as its capacitance, not only the insulating film capacitance Cox but also the junction capacitance Cnwell/pwell between the first p-well 34 and each of the first p-well 34a, the first p-well 34b, and the first p-well 34c and the junction capacitance Cnwell/psub between the first n-well 32 and the p-type region 30 in parallel. Then, as the junction capacitance Cnwell/pwell, the capacitance of side surface portions of the first p-well 34a, the first p-well 34b, and the first p-well 34c can be used. Accordingly, the junction capacitance Cnwell/pwell increases. Therefore, according to the non-volatile memory 500 of the fifth embodiment, it is possible to increase the capacitance of the capacitor.

In FIGS. 19 to 21, a case where three first p-wells are provided in the first n-well 32 has been described as an example. However, the number of first p-wells may be 2 or may be equal to or more than 4.

As described above, according to the semiconductor memory device of the fifth embodiment, it is possible to increase the capacitance of the capacitor.

In the first to fifth embodiments, the positional relationship between the cell array and the first capacitor or the second capacitor in the memory chip is not particularly limited. For example, the first capacitor or the second capacitor may be provided in the peripheral region of the memory cell array, or the first capacitor or the second capacitor may be provided directly under the memory cell array.

Although the three-dimensional NAND flash memory has been described as an example of the semiconductor memory device in the first to fifth embodiments, the semiconductor memory device is not limited to the three-dimensional NAND flash memory.

While certain embodiments have been described, these embodiments have been presented by way of example only, and are not intended to limit the scope of the inventions. Indeed, the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a memory cell array including a plurality of memory cells; and
a control circuit controlling an operation of each of the memory cells and including a first capacitor,
wherein the first capacitor includes:
a semiconductor substrate having a first face and a second face facing the first face, the semiconductor substrate including a first semiconductor region of p-type, a second semiconductor region of n-type provided between the first face and the first semiconductor region, and a third semiconductor region of p-type provided between the first face and the second semiconductor region, the third semiconductor region electrically connected to the first semiconductor region;
a first electrode electrically connected to the second semiconductor region; and
a first insulating film provided between the third semiconductor region and the first electrode.

2. The semiconductor memory device according to claim 1,
wherein the semiconductor substrate further includes a fourth semiconductor region of n-type provided between the first face and the third semiconductor region, the fourth semiconductor region provided on a third semiconductor region side of an end of the first electrode, the fourth semiconductor region electrically connected to the third semiconductor region.

3. The semiconductor memory device according to claim 2,
wherein an n-type impurity concentration in the fourth semiconductor region is higher than an n-type impurity concentration in the second semiconductor region.

4. The semiconductor memory device according to claim 2,
wherein the semiconductor substrate further includes a fifth semiconductor region of n-type provided between the third semiconductor region and the first insulating film, the fifth semiconductor region being in contact with the fourth semiconductor region.

5. The semiconductor memory device according to claim 4,
wherein the fifth semiconductor region is in contact with the first insulating film.

6. The semiconductor memory device according to claim 4,
wherein an n-type impurity concentration in the fifth semiconductor region is lower than an n-type impurity concentration in the fourth semiconductor region.

7. The semiconductor memory device according to claim 4,
wherein an n-type impurity concentration in the fifth semiconductor region is higher than an n-type impurity concentration in the second semiconductor region.

8. The semiconductor memory device according to claim 4,
wherein a depth of the fifth semiconductor region is smaller than a depth of the fourth semiconductor region.

9. The semiconductor memory device according to claim 1,
wherein the semiconductor substrate further includes a sixth semiconductor region of p-type provided between the first face and the second semiconductor region, the sixth semiconductor region spaced from the third semiconductor region, the sixth semiconductor region electrically connected to the first semiconductor region and the third semiconductor region.

10. The semiconductor memory device according to claim 2,
wherein the semiconductor substrate further includes a sixth semiconductor region of p-type provided between the first face and the second semiconductor region, the sixth semiconductor region spaced from the third semiconductor region, the sixth semiconductor region electrically connected to the first semiconductor region and the third semiconductor region.

11. The semiconductor memory device according to claim 1,
wherein the first electrode and the second semiconductor region are configured to apply a first voltage, the first semiconductor region and the third semiconductor region are configured to apply a second voltage, and the first voltage is higher than the second voltage.

12. The semiconductor memory device according to claim 1,
wherein each of the memory cells includes a semiconductor layer, a gate electrode, and a charge storage layer provided between the semiconductor layer and the gate electrode, and
the gate electrode is electrically connected to the first electrode.

13. The semiconductor memory device according to claim 1,
wherein the control circuit further includes a second capacitor, and
the second capacitor includes:
the semiconductor substrate including a seventh semiconductor region of n-type and an eighth semiconductor region of p-type, the seventh semiconductor region provided between the first face and the first semiconductor region and spaced from the second semiconductor region, and the eighth semiconductor region provided between the first face and the seventh semiconductor region and electrically connected to the first semiconductor region;
a second electrode electrically connected to the seventh semiconductor region; and
a second insulating film provided between the eighth semiconductor region and the second electrode and having a thickness smaller than a thickness of the first insulating film.

14. The semiconductor memory device according to claim 13,
wherein the first electrode and the second semiconductor region are configured to apply a first voltage, the first semiconductor region and the third semiconductor region are configured to apply a second voltage, the second electrode and the seventh semiconductor region are configured to apply a third voltage, the first voltage is higher than the second voltage, and the third voltage is higher than the second voltage and lower than the first voltage.

* * * * *